(12) United States Patent  (10) Patent No.: US 9,252,391 B2
Mandlik et al.  (45) Date of Patent: Feb. 2, 2016

(54) HYBRID LAYERS FOR USE IN COATINGS ON ELECTRONIC DEVICES OR OTHER ARTICLES

(71) Applicants: Princeton University, Princeton, NJ (US); UNIVERSAL DISPLAY CORPORATION, Ewing, NJ (US)

(72) Inventors: Prashant Mandlik, Princeton, NJ (US); Sigurd Wagner, Princeton, NJ (US); Jeffrey A. Silvernail, Ewing, NJ (US); Ruiqing Ma, Ewing, NJ (US); Julia J. Brown, Ewing, NJ (US); Lin Han, Princeton, NJ (US)

(73) Assignees: The Trustees of Princeton University, Princeton, NJ (US); Universal Display Corporation, Ewing, NJ (US)

( * ) Notice: Subject to any disclaimer, the term of this patent is extended or adjusted under 35 U.S.C. 154(b) by 40 days.

(21) Appl. No.: 14/065,877

(22) Filed: Oct. 29, 2013

(65) Prior Publication Data

US 2014/0054574 A1   Feb. 27, 2014

Related U.S. Application Data

(62) Division of application No. 12/990,860, filed as application No. PCT/US2009/042829 on May 5, 2009, now Pat. No. 8,592,253.

(60) Provisional application No. 61/051,265, filed on May 7, 2008.

(51) Int. Cl.
*H01L 51/52* (2006.01)
*C23C 16/02* (2006.01)
*C23C 16/04* (2006.01)
*C23C 16/22* (2006.01)
*C23C 16/30* (2006.01)
*C23C 16/40* (2006.01)
*C23C 16/455* (2006.01)
*C23C 16/505* (2006.01)
*C23C 16/517* (2006.01)
*C23C 16/52* (2006.01)
*C23C 30/00* (2006.01)

(52) U.S. Cl.
CPC ............ *H01L 51/5253* (2013.01); *C23C 16/02* (2013.01); *C23C 16/0272* (2013.01); *C23C 16/04* (2013.01); *C23C 16/22* (2013.01); *C23C 16/30* (2013.01); *C23C 16/40* (2013.01); *C23C 16/45523* (2013.01); *C23C 16/505* (2013.01); *C23C 16/517* (2013.01); *C23C 16/52* (2013.01); *C23C 30/00* (2013.01); *H01L 51/5203* (2013.01); *H01L 2251/566* (2013.01)

(58) Field of Classification Search
CPC .. H01L 51/00; H01L 51/0034; H01L 51/5237
USPC .............................. 257/40, 80–103
See application file for complete search history.

(56) References Cited

U.S. PATENT DOCUMENTS 7,968,146 B2 * 6/2011 Wagner et al. ............. 427/248.1

*Primary Examiner* — Cuong Q Nguyen
(74) *Attorney, Agent, or Firm* — Riverside Law LLP

(57) ABSTRACT

A method for protecting an electronic device comprising an organic device body. The method involves the use of a hybrid layer deposited by chemical vapor deposition. The hybrid layer comprises a mixture of a polymeric material and a non-polymeric material, wherein the weight ratio of polymeric to non-polymeric material is in the range of 95:5 to 5:95, and wherein the polymeric material and the non-polymeric material are created from the same source of precursor material. Also disclosed are techniques for impeding the lateral diffusion of environmental contaminants.

7 Claims, 26 Drawing Sheets

FIG. 10A
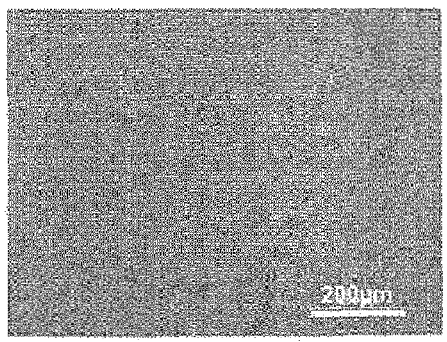
Before cyclic testing
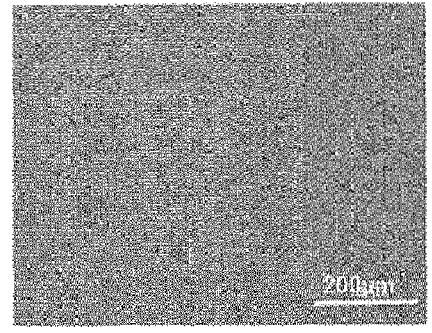
After 58,600 cycles at ε = 0.2%
FIG. 10B
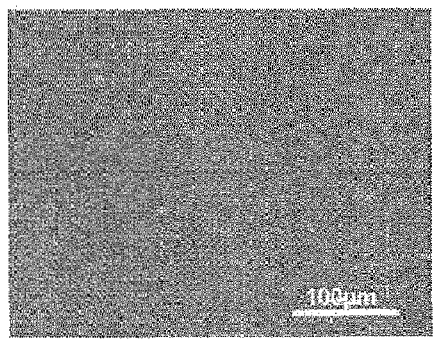
First crack at ε = 0.4%
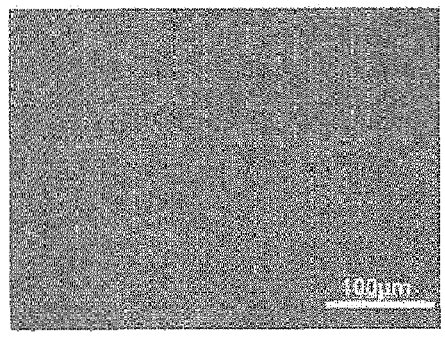
Extensive cracking at ε = 2.7%

FIG. 11
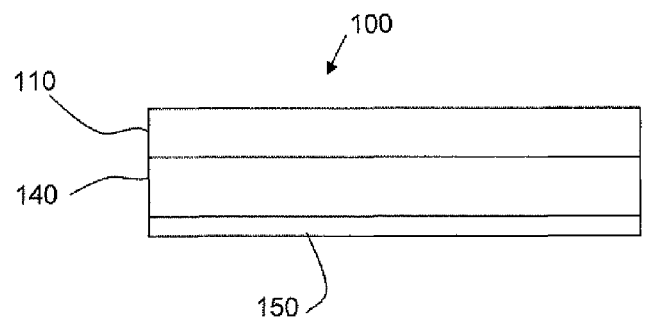
FIG. 12
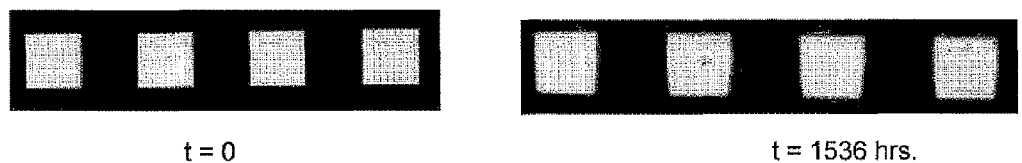

FIG. 16
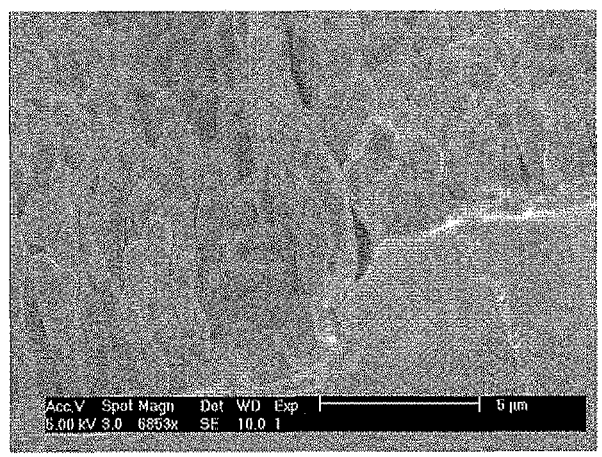
A
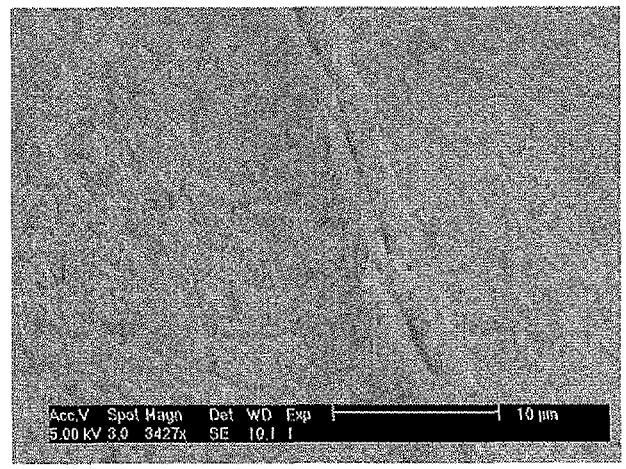
B

FIG. 17
A
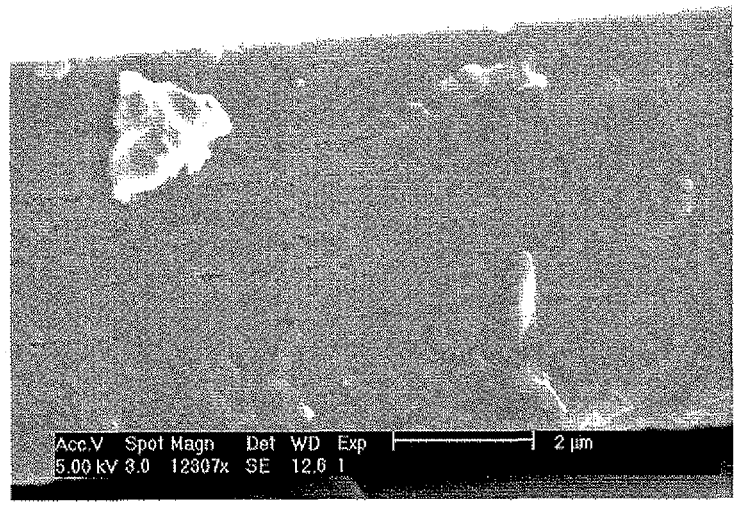
B
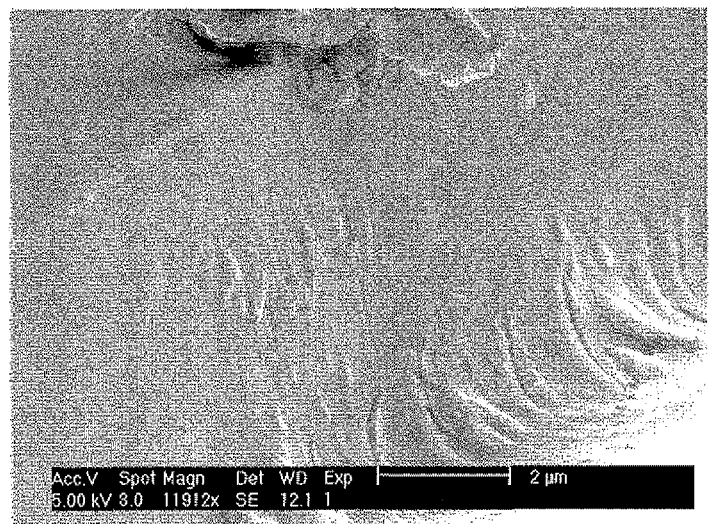

US 9,252,391 B2

HYBRID LAYERS FOR USE IN COATINGS ON ELECTRONIC DEVICES OR OTHER ARTICLES

RELATED APPLICATIONS

This application is a divisional of U.S. Non-Provisional Application Ser. No. 12/990,860, filed May 5, 2009, which in turn is a National Stage Entry of International Application No. PCT/US2009/42829, filed May 5, 2009, which in turn claims priority benefit from U.S. Provisional Application Ser. No. 61/051,265 (filed May 7, 2008), all of which are incorporated by reference herein in their entireties.

GOVERNMENT RIGHTS

Using the specific language required by 37 C.F.R. §401.14 (f)(4): This invention was made with government support under grant number W911QX-06-C-0017 awarded by the U.S. Army Research Office. The government has certain rights in the invention.

TECHNICAL FIELD

The present invention relates to barrier coatings for electronic devices.

BACKGROUND

Organic electronic devices, such as organic light-emitting devices (OLEDs), are vulnerable to degradation when exposed to water vapor or oxygen. A protective barrier coating over the OLED to reduce its exposure to water vapor or oxygen could help to improve the lifetime and performance of the device. Films of silicon oxide, silicon nitride, or aluminum oxide, which have been successfully used in food packaging, have been considered for use as barrier coatings for OLEDs. However, these inorganic films tend to contain microscopic defects which allow some diffusion of water vapor and oxygen through the film. In some cases, the defects open as cracks in the brittle film. While this level of water and oxygen diffusion may be acceptable for food products, it is not acceptable for OLEDs. To address these problems, multilayer barrier coatings that use alternating inorganic and polymer layers have been tested on OLEDs and found to have improved resistance to water vapor and oxygen penetration. But these multilayer coatings have the disadvantages of complexity and cost. Thus, there is a need for other methods of forming barrier coatings suitable for use in protecting OLEDs.

BRIEF DESCRIPTION OF THE DRAWINGS

FIGS. 10A and 10B show optical micrographs of the surface of a 4 μm hybrid layer deposited on a 50 μm thick Kapton polyimide foil.

FIG. 11 shows a cross-sectional view of a portion of an encapsulated OLED according to an embodiment.

FIG. 12 shows the results of accelerated environmental tests of complete OLEDs with barrier coatings.

FIGS. 16A and 16B show scanning electron micrographs of a cross-section of a hybrid layer according to another embodiment.

FIG. 17A shows a scanning electron micrograph of a cross-section of a hybrid layer deposited under one set conditions. FIG. 17B shows a scanning electron micrograph of a cross-section of a hybrid layer deposited under another set conditions.

DETAILED DESCRIPTION

Figure 1:
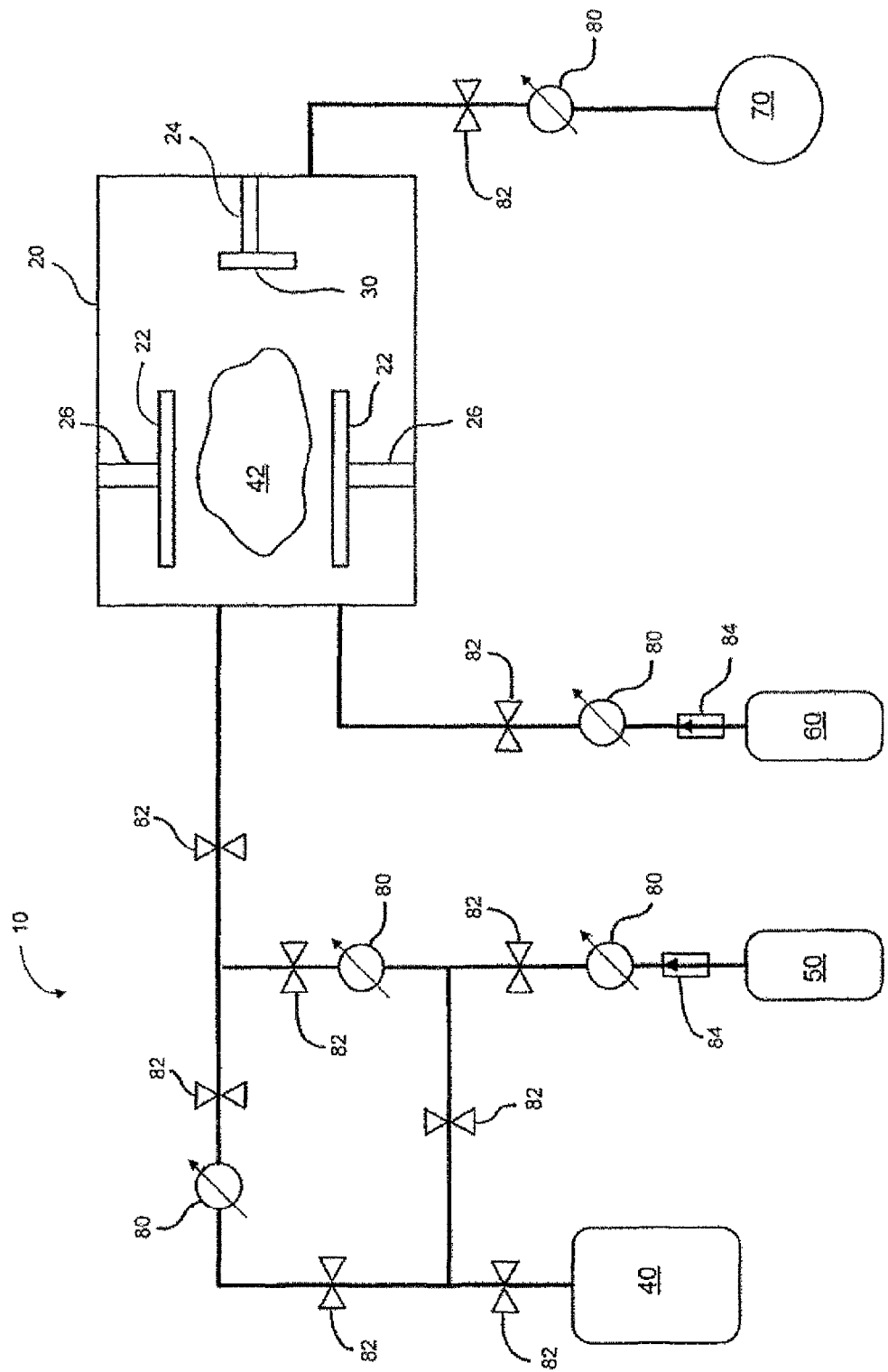
FIG. 1 shows a schematic diagram of a PE-CVD apparatus that can be used for implementing certain embodiments of the present invention.

In one aspect, the present invention provides a method for forming a coating over a surface. The method comprises depositing over the surface, a hybrid layer comprising a mixture of a polymeric material and a non-polymeric material. The hybrid layer may have a single phase or multiple phases.

As used herein, the term "non-polymeric" refers to a material made of molecules having a well-defined chemical formula with a single, well-defined molecular weight. A "non-polymeric" molecule can have a significantly large molecular weight. In some circumstances, a non-polymeric molecule may include repeat units. As used herein, the term "polymeric" refers to a material made of molecules that have repeating subunits that are covalently linked, and that has a molecular weight that may vary from molecule to molecule because the polymerizing reaction may result in different numbers of repeat units for each molecule. Polymers include, but are not limited to homopolymers and copolymers such as block, graft, random, or alternating copolymers, as well as blends and modifications thereof. Polymers include, but are not limited to, polymers of carbon or silicon.

As used herein, a "mixture of a polymeric material and a non-polymeric material" refers to a composition that one of ordinary skill in the art would understand to be neither purely polymeric nor purely non-polymeric. The term "mixture" is intended to exclude any polymeric materials that contain incidental amounts of non-polymeric material (that may, for example, be present in the interstices of polymeric materials as a matter of course), but one of ordinary skill in the art would nevertheless consider to be purely polymeric. Likewise, this is intended to exclude any non-polymeric materials that contain incidental amounts of polymeric material, but one of ordinary skill in the art would nevertheless consider to be purely non-polymeric. In some cases, the weight ratio of polymeric to non-polymeric material in the hybrid layer is in the range of 95:5 to 5:95, and preferably in the range of 90:10 to 10:90, and more preferably, in the range of 25:75 to 10:90.

The polymeric/non-polymeric composition of a layer may be determined using various techniques, including wetting contact angles of water droplets, IR absorption, hardness, and flexibility. In certain instances, the hybrid layer has a wetting contact angle in the range of 30° to 85°, and preferably, in the range of 30° to 60°, and more preferably, in the range of 36° to 60°. Note that the wetting contact angle is a measure of composition if determined on the surface of an as-deposited film. Because the wetting contact angle can vary greatly by post-deposition treatments, measurements taken after such treatments may not accurately reflect the layer's composition. It is believed that these wetting contact angles are applicable to a wide range of layers formed from organo-silicon precursors. In certain instances, the hybrid layer has a nano-indentation hardness in the range of 3 to 20 GPa, and preferably, in the range of 10 to 18 GPa. In certain instances, the hybrid layer has a surface roughness (root-mean-square) in the range of 0.1 nm to 10 nm, and preferably, in the range of 0.2 nm to 0.35 nm. In certain instances, the hybrid layer, when deposited as a 4 μm thick layer on a 50 μm thick polyimide foil substrate, is sufficiently flexible that no microstructural changes are observed after at least 55,000 rolling cycles on a 1 inch diameter roll at a tensile strain ($\epsilon$) of 0.2%, or alternatively at a tensile strain ($\epsilon$) of 0.1%. In certain instances, the hybrid layer is sufficiently flexible that no cracks appear under a tensile strain ($\epsilon$) of at least 0.35% (a tensile strain level which would normally crack a 4 μm pure silicon oxide layer, as considered by a person of ordinary skill in the art).

The term "mixture" is intended to include compositions having a single phase as well as compositions having multiple phases. Therefore, a "mixture" excludes subsequently deposited alternating polymeric and non-polymeric layers. Put another way, to be considered a "mixture," a layer should be deposited under the same reaction conditions and/or at the same time.

The hybrid layer is formed by chemical vapor deposition using a single source of precursor material. As used herein, "single source of precursor material" refers to a source that provides all the precursor materials that are necessary to form both the polymeric and non-polymeric materials when the precursor material is deposited by CVD, with or without a reactant gas. This is intended to exclude methods where the polymeric material is formed using one precursor material, and the non-polymeric material is formed using a different precursor material. By using a single source of precursor material, the deposition process is simplified. For example, a single source of precursor material will obviate the need for separate streams of precursor materials and the attendant need to supply and control the separate streams.

The precursor material may be a single compound or a mixture of compounds. Where the precursor material is a mixture of compounds, in some cases, each of the different compounds in the mixture is, by itself, able to independently serve as a precursor material. For example, the precursor material may be a mixture of hexamethyl disiloxane (HMDSO) and dimethyl siloxane (DMSO).

In some cases, plasma-enhanced CVD (PE-CVD) may be used for deposition of the hybrid layer. PE-CVD may be desirable for various reasons, including low temperature deposition, uniform coating formation, and controllable process parameters. Various PE-CVD processes which are suitable for use in the present invention are known in the art, including those that use RF energy to generate the plasma.

The precursor material is a material that is capable of forming both a polymeric material and a non-polymeric material when deposited by chemical vapor deposition. Various such precursor materials are suitable for use in the present invention and are chosen for their various characteristics. For example, a precursor material may be chosen for its content of chemical elements, its stoichiometric ratios of the chemical elements, and/or the polymeric and non-polymeric materials that are formed under CVD. For instance, organo-silicon compounds, such as siloxanes, are a class of compounds suitable for use as the precursor material. Representative examples of siloxane compounds include hexamethyl disiloxane (HMDSO) and dimethyl siloxane (DMSO). When deposited by CVD, these siloxane compounds are able to form polymeric materials, such as silicone polymers, and non-polymeric materials, such as silicon oxide. The precursor material may also be chosen for various other characteristics such as cost, non-toxicity, handling characteristics, ability to maintain liquid phase at room temperature, volatility, molecular weight, etc.

Other organo-silicon compounds suitable for use as a precursor material include methylsilane; dimethylsilane; vinyl trimethylsilane; trimethylsilane; tetramethylsilane; ethylsilane; disilanomethane; bis(methylsilano)methane; 1,2-disilanoethane; 1,2-bis(methylsilano)ethane; 2,2-disilanopropane; 1,3,5-trisilano-2,4,6-trimethylene, and fluorinated derivatives of these compounds. Phenyl-containing organo-silicon compounds suitable for use as a precursor material include: dimethylphenylsilane and diphenylmethylsilane. Oxygen-containing organo-silicon compounds suitable for use as a precursor material include: dimethyldimethoxysilane; 1,3,5,7-tetramethylcyclotetrasiloxane; 1,3-dimethyldisiloxane; 1,1,3,3-tetramethyldisiloxane; 1,3-bis(silanomethylene)disiloxane; bis(1-methyldisiloxanyl)methane; 2,2-bis(1-methyldisiloxanyl)propane; 2,4,6,8-tetramethylcyclotetrasiloxane; octamethylcyclotetrasiloxane; 2,4,6,8,10-pentamethylcyclopentasiloxane; 1,3,5,7-tetrasilano-2,6-dioxy-4,8-dimethylene; hexamethylcyclotrisiloxane; 1,3,5,7,9-pentamethylcyclopentasiloxane; hexamethoxydisiloxane, and fluorinated derivatives of these compounds. Nitrogen-containing organo-silicon compounds suitable for use as a precursor material include: silazanes such as hexamethyldisilazane, dimethylsilazane, divinyltetramethyldisilizane, or hexamethylcyclotrisilazane; dimethylbis(N-methylacetamido)silane; dimethylbis-(N-ethylacetamido)silane; methylvinylbis(N-methylacetamido)silane; methylvinylbis(N-butylacetamido) silane; methyltris(N-phenylacetamido)silane; vinyltris(N-ethylacetamido)silane; tetrakis(N-methylacetamido)silane; diphenylbis(diethylaminoxy)silane; methyltris(diethylaminoxy)silane; and bis(trimethylsilyl)carbodiimide.

When deposited by CVD, the precursor material may form various types of polymeric materials in various amounts, depending upon the type of precursor material, the presence of any reactant gases, and other reaction conditions. The polymeric material may be inorganic or organic. For example, where organo-silicon compounds are used as the precursor material, the deposited hybrid layer may include polymer chains of Si—O bonds, Si—C bonds, or Si—O—C bonds to form polysiloxanes, polycarbosilanes, and polysilanes, as well as organic polymers.

When deposited by CVD, the precursor material may form various types of non-polymeric materials in various amounts, depending upon the type of precursor material, the presence of any reactant gases, and other reaction conditions. The non-polymeric material may be inorganic or organic. For example, where organo-silicon compounds are used as the precursor material in combination with an oxygen-containing reactant gas, the non-polymeric material may include silicon oxides, such as SiO, $SiO_2$, and mixed-valence oxides $SiO_x$. When deposited with a nitrogen-containing reactant gas, the non-polymeric material may include silicon nitrides ($SiN_x$). Other non-polymeric materials that may be formed include silicon oxycarbide and silicon oxynitrides.

When using PE-CVD, the precursor material may be used in conjunction with a reactant gas that reacts with the precursor material in the PE-CVD process. The use of reactant gases in PE-CVD is known in the art and various reactant gases are suitable for use in the present invention, including oxygen-containing gases (e.g., $O_2$, ozone, water) and nitrogen-containing gases (e.g., ammonia). The reactant gas may be used to vary the stoichiometric ratios of the chemical elements present in the reaction mixture. For example, when a siloxane precursor material is used with an oxygen or nitrogen-containing reactant gas, the reactant gas will change the stoichiometric ratios of oxygen or nitrogen in relation to silicon and carbon in the reaction mixture. This stoichiometric relation between the various chemical elements (e.g., silicon, carbon, oxygen, nitrogen) in the reaction mixture may be varied in several ways. One way is to vary the concentration of the precursor material or the reactant gas in the reaction. Another way is to vary the flow rates of the precursor material or the reactant gas into the reaction. Another way is to vary the type of precursor material or reactant gas used in the reaction.

Changing the stoichiometric ratios of the elements in the reaction mixture can affect the properties and relative amounts of the polymeric and non-polymeric materials in the deposited hybrid layer. For example, a siloxane gas may be combined with varying amounts of oxygen to adjust the amount of non-polymeric material relative to the polymeric material in the hybrid layer. By increasing the stoichiometric ratio of oxygen in relation to the silicon or carbon, the amount of non-polymeric material, such as silicon oxides, may be increased. Similarly, by reducing the stoichiometric ratio of oxygen, the amount of silicon and carbon-containing polymeric material may be increased. The composition of the hybrid layer may also be varied by adjusting other reaction conditions. For example, in the case of PE-CVD, process parameters such as RF power and frequency, deposition pressure, deposition time, and gas flow rates can be varied.

Thus, by using the methods of the present invention, it is possible to form a hybrid layer of hybrid polymeric/non-polymeric character and having characteristics suitable for use in various applications. Such characteristics include optical transparency (e.g., in some cases, the hybrid layer is optically transparent), impermeability, flexibility, thickness, adhesion, and other mechanical properties. For example, one or more of these characteristics may be adjusted by varying the weight % of polymeric material in the hybrid layer, with the remainder being non-polymeric material. For instance, to achieve a desired level of flexibility and impermeability, the wt % polymeric material may preferably be in the range of 5 to 95%, and more preferably in the range of 10 to 25%. However, other ranges are also possible depending upon the application.

Barrier layers made of purely non-polymeric materials, such as silicon oxide, can have various advantages relating to optical transparency, good adhesion, and good film stress. However, these non-polymeric layers tend to contain microscopic defects which allow the diffusion of water vapor and oxygen through the layer. Providing some polymeric character to the non-polymeric layer can reduce the permeability of the layer without significantly altering the advantageous properties of a purely non-polymeric layer. Without intending to be bound by theory, the inventors believe that a layer having hybrid polymeric/non-polymeric character reduces the permeability of the layer by reducing the size and/or number of defects, in particular microcracks.

Figure 21:
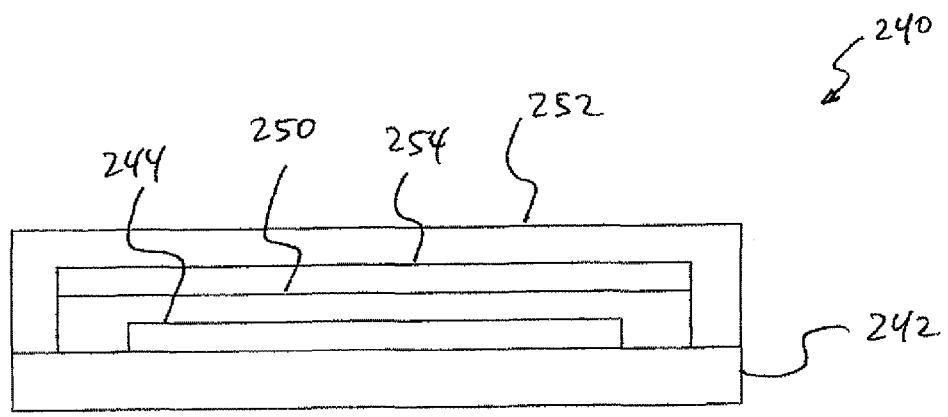
FIG. 21 shows an encapsulated OLED according to another embodiment.

In some cases, the coating of the present invention may have a plurality of hybrid layers, wherein the composition of each hybrid layer can vary independently. In some cases, the weight % ratio of one hybrid layer differs by at least 10 weight % from another hybrid layer in the coating. The thickness of each hybrid layer can also vary independently. The different hybrid layers can be created by sequentially adjusting the reaction conditions used in depositing the hybrid layer. For example, in a PE-CVD process, the amount of reactant gas provided to the reaction mixture may be adjusted sequentially to produce multiple hybrid layers, with each hybrid layer being discrete and having a different composition.

Where the coating has a zone where its composition changes substantially continuously from one elevation to another, a hybrid layer within that zone may be very thin, even as thin as the smallest molecular unit within the coating. For example, the coating may have a zone where the wt % ratio of polymeric material to non-polymeric material varies continuously. The continuous variation may be linear (e.g., the wt % ratio of polymeric to non-polymeric material may steadily increase with higher elevation) or non-linear (e.g., cyclically increasing and decreasing).

Where the plurality of hybrid layers are being deposited under a vacuum, the vacuum may be broken between the deposition of the hybrid layers. This step may be useful in enhancing the ability of the separately deposited layers to form with minimal discontinuities between the layers. For example, exposure of the deposited layer to atmospheric oxygen during the vacuum break may oxidize the layer and improve its adhesiveness.

Where a plurality of hybrid layers are used, a subsequently deposited hybrid layer can be made to extend over the edges of an underlying hybrid layer (i.e., the subsequently deposited hybrid layer has a larger footprint than the underlying hybrid layer). This configuration can be useful in protecting the edges of the hybrid layer from the lateral ingress of environmental contaminants (e.g., moisture or oxygen). Further, other polymer layers may be positioned between the plurality of hybrid layers. For example, referring to the embodiment shown in FIG. 21, an electronic device 240 comprises an OLED body 244 (comprising a stack of organic layers) mounted on a substrate 242. OLED body 244 is coated with a first hybrid layer 250, which extends over the edges of OLED body 244. First hybrid layer 250 is coated with a polymer layer 254, which is then coated with a second hybrid layer 252 that extends over the edges of polymer layer 254 and OLED body 244, coming into contact with the surface of substrate 242. By covering over the edge of first hybrid layer 250, second hybrid layer 252 serves to impede the lateral ingress of environmental contaminants from the edge of first hybrid layer 250.

The hybrid layer may be deposited over various types of articles. In some cases, the article may be an organic electronic device, such as an OLED. For an OLED, the hybrid layer may serve as a barrier coating that resists permeation of water vapor and oxygen. For example, a hybrid layer having a water vapor transmission rate of less than $10^{-6}$ g/m$^2$/day and/or an oxygen transmission rate of less than $10^{-3}$ cm$^3$/m$^2$/day (or in some cases, less than $10^{-4}$ cm$^3$/m$^2$/day) may be suitable for protecting OLEDs. In some cases, the thickness of the hybrid layer can range from 0.1 to 10 μm, but other thicknesses can also be used depending upon the application. Also, hybrid layers having a thickness and material composition that confers optical transparency may be suitable for use with OLEDs. For use with flexible OLEDs, the hybrid layer may be designed to have the desired amount of flexibility. In some cases, the hybrid layer may be used on other articles that are sensitive to degradation upon exposure to the environment, such as pharmaceuticals, medical devices or implants, biologic agents, biological samples, biosensors, or sensitive measuring equipment.

In some cases, the hybrid layer may be used in combination with an unmixed layer that can also be formed by using the same single source of precursor material, such as an unmixed polymeric layer or an unmixed non-polymeric layer. The unmixed layer may be deposited before or after the hybrid layer is deposited.

Any of various types of CVD reactors may be used to implement the methods of the present invention. As one example, FIG. 1 shows a PE-CVD apparatus 10 that can be used to implement certain embodiments of the present invention. PE-CVD apparatus 10 comprises a reaction chamber 20 in which an electronic device 30 is loaded onto a holder 24. Reaction chamber 20 is designed to contain a vacuum and a vacuum pump 70 is connected to reaction chamber 20 to create and/or maintain the appropriate pressure. An N$_2$ gas tank 50 provides N$_2$ gas for purging apparatus 10. Reaction chamber 20 may further include a cooling system to reduce the heat that is generated by the reaction.

For handling the flow of gases, apparatus 10 also includes various flow control mechanisms (such as mass flow controllers 80, shut-off valves 82, and check valves 84) which may be under manual or automated control. A precursor material source 40 provides a precursor material (e.g., HMDSO in liquid form) which is vaporized and fed into reaction chamber 20. In some cases, the precursor material may be transported to reaction chamber 20 using a carrier gas, such as argon. A reactant gas tank 60 provides the reactant gas (e.g., oxygen), which is also fed into reaction chamber 20. The precursor material and reactant gas flow into reaction chamber 20 to create a reaction mixture 42. The precursor material and reactant gas may be flowed separately into reaction chamber 20, or be pre-mixed prior to entering reaction chamber 20. The pressure inside reaction chamber 20 may be adjusted further to achieve the deposition pressure. Reaction chamber 20 includes a set of electrodes 22 mounted on electrode standoffs 26, which may be conductors or insulators. A variety of arrangements of device 30 and electrodes 22 are possible. Diode or triode electrodes, or remote electrodes may be used. Device 30 may be positioned remotely as shown in FIG. 1, or may be mounted on one or both electrodes of a diode configuration.

Electrodes 22 are supplied with RF power to create plasma conditions in the reaction mixture 42. Reaction products created by the plasma are deposited onto electronic device 30. The reaction is allowed to proceed for a period of time sufficient to deposit a hybrid layer on electronic device 30. The reaction time will depend upon various factors, such as the position of device 30 with respect to electrodes 22, the type of hybrid layer to be deposited, the reaction conditions, the desired thickness of the hybrid layer, the precursor material, and the reactant gas. The reaction time may be a duration between 5 seconds to 5 hours, but longer or shorter times may also be used depending upon the application.

Table 1 below shows the reaction conditions that were used to make three example hybrid layers. The hybrid layer of Example 1 contained approximately 7% polymeric material and 93% non-polymeric material, as determined from the wetting contact angles of water droplets. The hybrid layer of Example 2 contained approximately 94% polymeric material and 6% non-polymeric material, as determined from the wetting contact angles of water droplets. The hybrid layer of Example 3 contained approximately 25% polymeric material and 75% non-polymeric material, as determined from the wetting contact angles of water droplets. In each of Examples 1-3, with the reaction conditions having been kept constant throughout the deposition process, the hybrid layer is in a single phase with a homogenous composition throughout. As also demonstrated by Examples 1-3, the hybrid layer may be in a single phase with a homogenous composition over a thickness of at least 800 Å, and in some cases, over a thickness in the range of 800 Å-60,000 Å. However, in other embodiments, by varying the reaction conditions in the manner described above, the hybrid layer can have multiple phases by way of multiple different sublayers, each with a different composition.

TABLE 1

| Hybrid Layer | HMDSO source temp (° C.) | HMDSO gas flow rate (sccm) | $O_2$ gas flow rate (sccm) | Pressure (m torr) | RF power (W) | Deposition time (min) | Film thickness (Å) |
|---|---|---|---|---|---|---|---|
| Example 1 | 33 | 0.4 | 300 | 600 | 5 | 30 | 800 |
| Example 2 | 33 | 10 | 13 | 130 | 18 | 10 | 1,600 |
| Example 3 | 33 | 1.5 | 50 | 150 | 60 | 135 | 60,000 |

Figure 2:
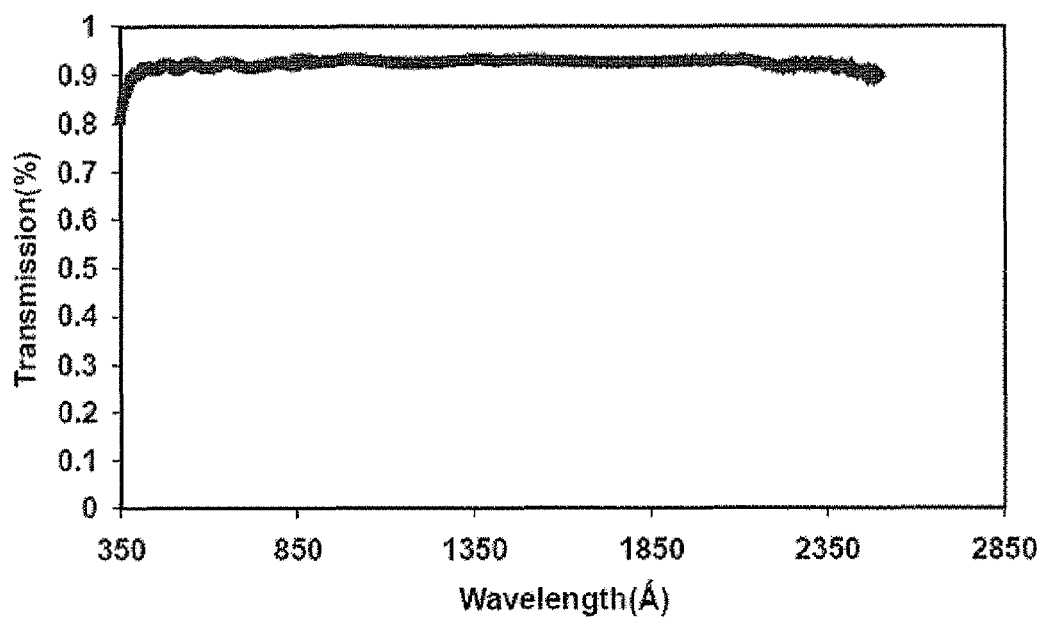
FIG. 2 shows the optical transmission spectrum of a hybrid layer according to an embodiment.
Figure 3:
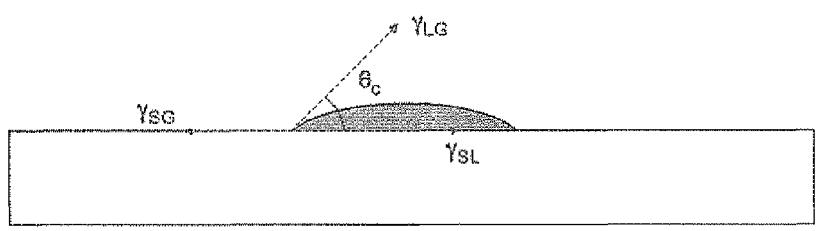
FIG. 3 shows how the contact angle of a water droplet on a film is measured.
Figure 4:
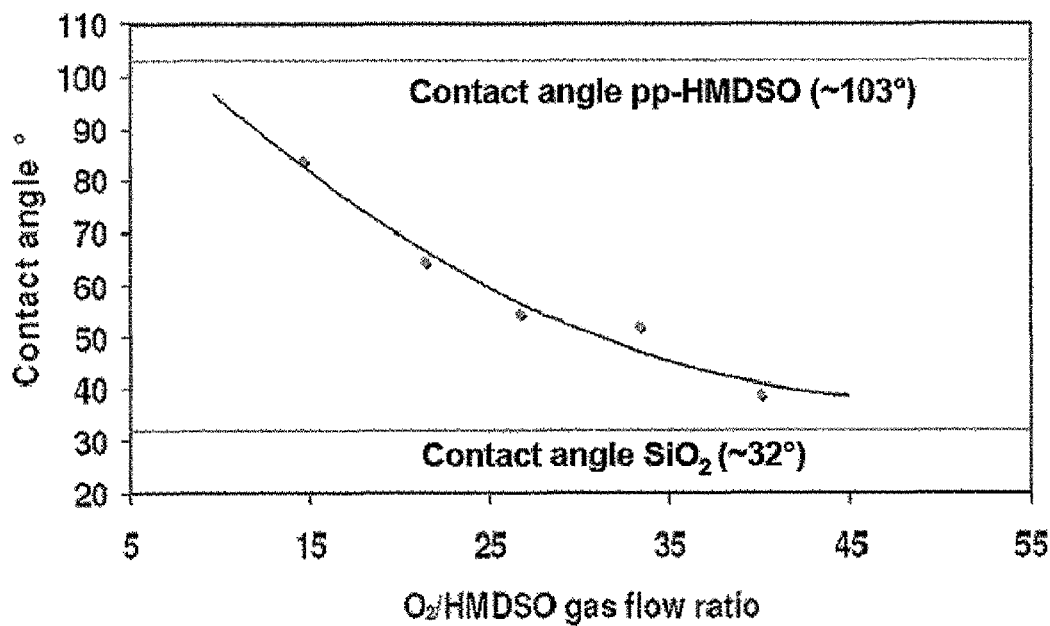
FIG. 4 shows a plot of the contact angles of several hybrid layers formed under various $O_2$/HMDSO gas flow ratios.

FIG. 2 shows the optical transmission spectrum of the hybrid layer of Example 3. This hybrid layer has greater than 90% transmittance from the near-UV to the near-IR spectrum. FIG. 3 shows how the contact angle of a water droplet on a film is measured. FIG. 4 is a plot of the contact angles of several hybrid layers formed under various $O_2$/HMDSO gas flow ratios in comparison to the contact angles of a pure $SiO_2$ film and a pure polymer film. The contact angles of the hybrid layers approach that of a pure $SiO_2$ film as the oxygen flow rate in the deposition process increases.

Figure 5:
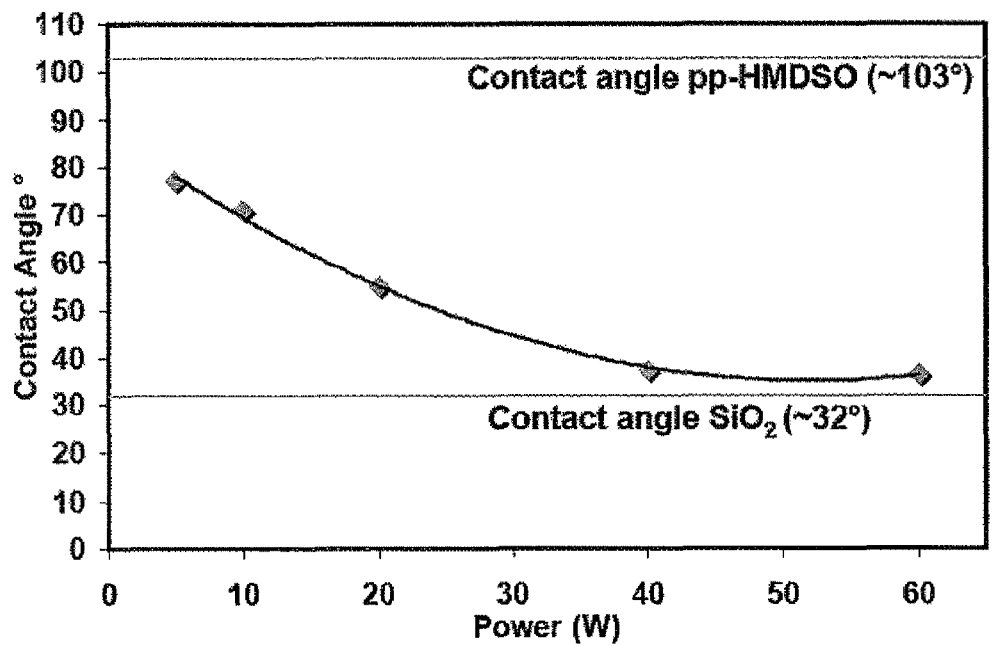
FIG. 5 shows a plot of the contact angles of several hybrid layers formed under various power levels applied during the PE-CVD process.
Figure 6:
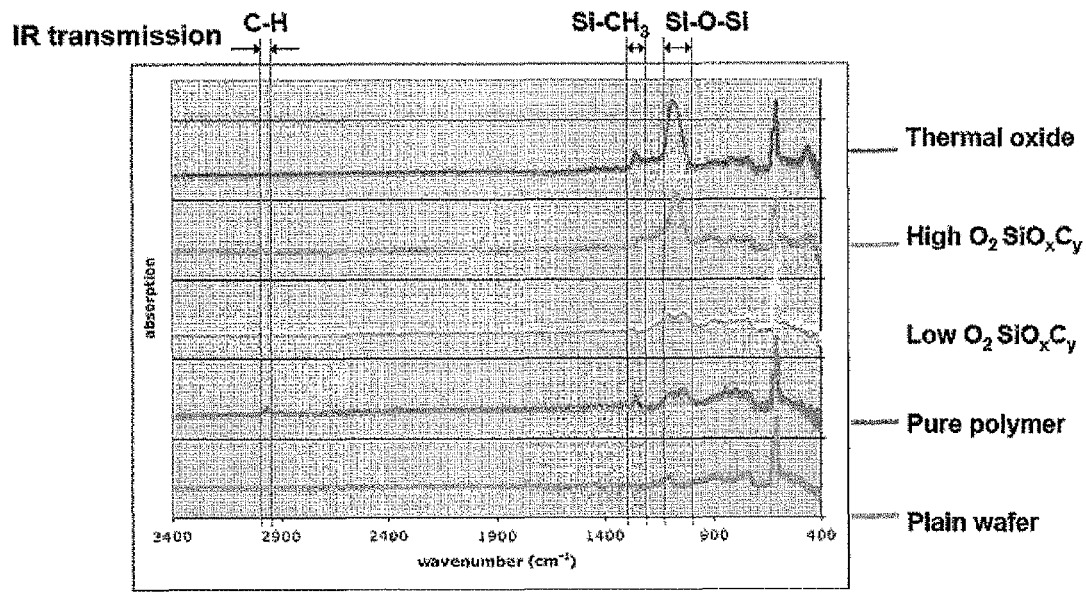
FIG. 6 shows the infrared absorption spectra of hybrid layers formed using a relatively high $O_2$ flow and a relatively low $O_2$ flow in comparison to films of pure $SiO_2$ (thermal oxide) or pure polymer.
Figure 7:
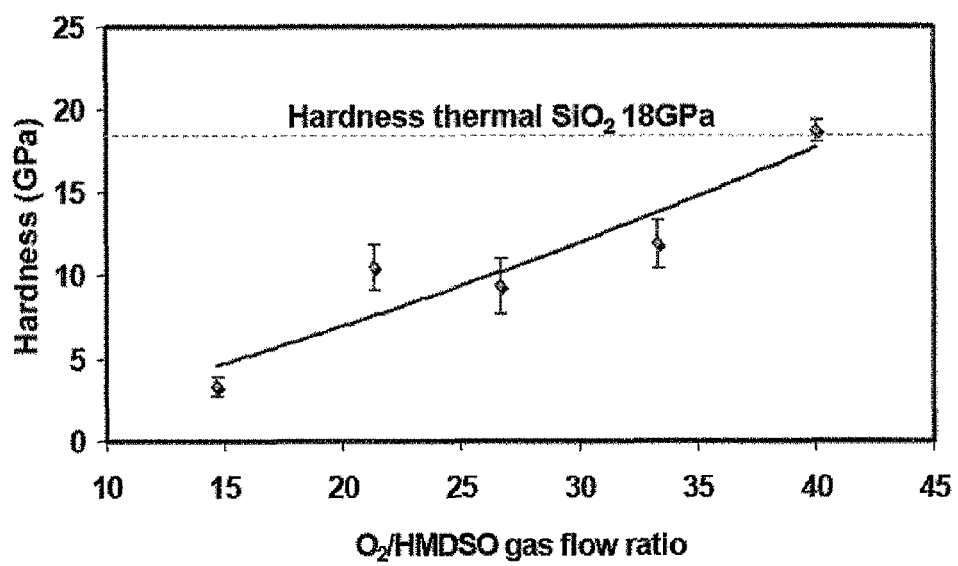
FIG. 7 shows a plot of the nano-indentation hardness of various hybrid layers formed under various $O_2$/HMDSO gas flow ratios in comparison to the hardness of a pure $SiO_2$ film.

FIG. 5 is a plot of the contact angles of several hybrid layers formed under various power levels applied during the PE-CVD process. The contact angles of the hybrid layers approach that of a pure $SiO_2$ film as the power level increases, which may be due to the fact that higher power levels make $O_2$ a stronger oxidant. FIG. 6 shows the infrared absorption spectra of hybrid layers formed using a relatively high $O_2$ flow and a relatively low $O_2$ flow in comparison to films of pure $SiO_2$ (thermal oxide) or pure polymer. The high $O_2$ hybrid layer shows strong peaks in the Si—O—Si band. The nominal peaks in the Si—$CH_3$ band for the thermal oxide (pure $SiO_2$) film are believed to be related to Si—O vibrations. FIG. 7 is a plot of the nano-indentation hardness of various hybrid layers formed under various $O_2$/HMDSO gas flow ratios in comparison to the hardness of a pure $SiO_2$ film. The hardness of the hybrid layers increases as the oxygen flow rate in the deposition process increases, and these hybrid layers can be nearly as hard pure $SiO_2$ films, and yet be tough and highly flexible.

Figure 8:
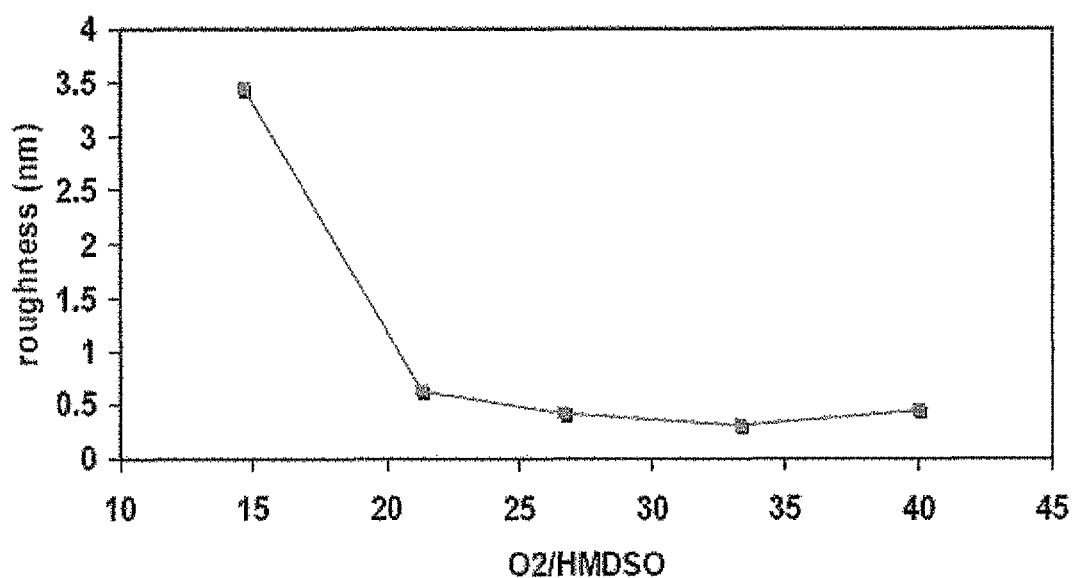
FIG. 8 shows a plot of the surface roughness of several hybrid layers formed under various $O_2$/HMDSO gas flow ratios.
Figure 9:
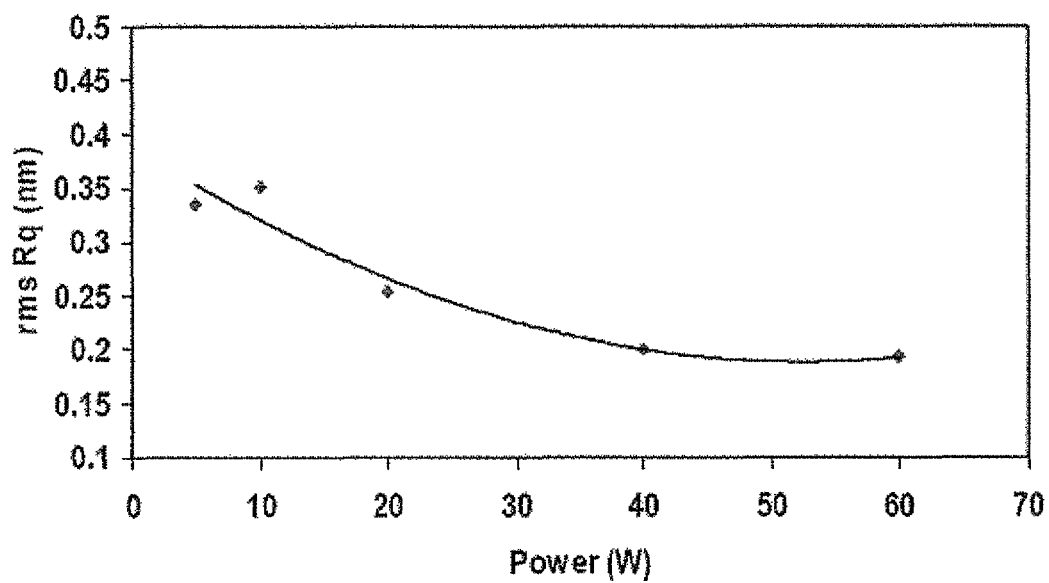
FIG. 9 shows a plot of the surface roughness of several hybrid layers formed under various power levels.

FIG. 8 is a plot of the surface roughness (root-mean-square), measured by atomic force microscopy, of several hybrid layers formed under various $O_2$/HMDSO gas flow ratios, and shows that the surface roughness decreases with increasing $O_2$ flow rates used in the deposition process. FIG. 9 is a plot of the surface roughness (root-mean-square), measured by atomic force microscopy, of several hybrid layers formed under various power levels, and shows that the surface roughness decreases with increasing power levels used in the deposition process.

FIGS. 10A and 10B show optical micrographs of the surface of a 4 μm hybrid layer (deposited under the same source temperature, gas flow rates, pressure, and RF power of Example 3 above) on a 50 μm thick Kapton polyimide foil. In FIG. 10A, the images were obtained before and after the coated foil was subjected to cyclic rolling on a 1 inch diameter roll (tensile strain ε=0.2%). No microstructural changes were observed after 58,600 rolling cycles. In FIG. 10B, the coated foil was subjected to increasing tensile strain, and the images were obtained after the appearance of first cracking (roll diameter of 14 mm) and after extensive cracking (roll diameter of 2 mm). These flexibility results demonstrate that the methods of the present invention can provide a coating that is highly flexible.

FIG. 11 shows a cross-sectional view of a portion of an encapsulated OLED 100, which comprises the OLED proper 140 on a substrate 150, and the hybrid layer of Example 3 above, as a barrier coating 110. FIG. 12 shows the results of accelerated environmental tests of complete OLEDs with barrier coatings. Both bottom-emitting OLEDs and transparent OLEDs were coated with the 6-μm thick hybrid layer of Example 3. The devices were then stored in an environmental chamber at 65° C. and 85% relative humidity. The images show the condition of the OLEDs at the initial time point and after the indicated time intervals. The OLEDs continued to function after well over 1000 hours, demonstrating that the methods of the present invention can provide a coating that effectively protects against the degradative effects of environmental exposure.

In instances where the hybrid layer is used as an environmental barrier for an electronic device, the hybrid layer may serve as the surface upon which the electronic device is disposed, the cover for the electronic device, or both. For example, one hybrid layer may be deposited over the electronic device to cover it and another hybrid layer may be deposited on the substrate below the electronic device to provide a surface upon which the electronic device is disposed. In this way, the electronic device is sealed between the two hybrid layers.

Figure 13:
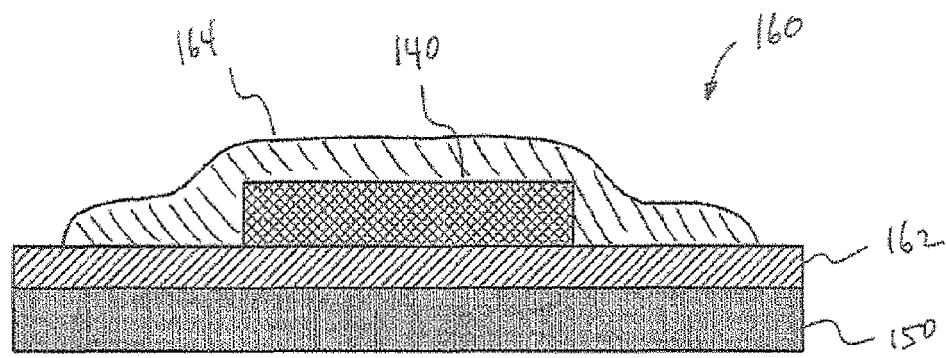
FIG. 13 shows an encapsulated OLED according to another embodiment.

For example, referring to the embodiment shown in FIG. 13, an encapsulated OLED 160 comprises a substrate 150 with a hybrid layer 162 deposited thereon. The body 140 of the OLED (including the electrodes) is disposed on the surface of hybrid layer 162. Another hybrid layer 164, which may or may not have the same composition as hybrid layer 162, is deposited over OLED body 140 as a conformal coating. As such, in addition to covering the top of OLED body 140, hybrid layer 164 also extends down the sides of OLED body 140 and contacts the surface of hybrid layer 162. In this way, OLED body 140 is sandwiched between hybrid layer 162 and hybrid layer 164.

In certain embodiments, the surface on which the hybrid layer is deposited may be pretreated prior to depositing the hybrid layer in order to increase the interfacial cohesion between the surface and the hybrid layer. The surface pretreatment may modify various surface properties, including enhancing the adhesiveness of the surface, modifying the surface chemistry (e.g., activating the surface), changing the surface roughness, increasing the surface energy, planarizing the surface, and/or cleaning the surface. By increasing the interfacial cohesion between the surface and the hybrid layer, this feature can be useful in reducing the lateral diffusion of environmental contaminants (such as moisture or oxygen) from the edges of the hybrid layer.

Various types of surface treatments that can increase the interfacial cohesion between the surface and the hybrid layer are suitable for use in the present invention, including mechanical abrasion, chemical treatments (e.g., exposure to oxidizing agents, activation by introduction of functional groups) or physical-chemical treatments (e.g., exposure to plasma, corona discharge, or UV irradiation). Where plasma treatment is used, the treatment may be performed in the same chamber used to deposit the hybrid layer, or the plasma treatment may be performed in a separate apparatus, in which case, any of the various types of plasma treatment apparatuses known in the art may be used, including barrel-type plasma systems and parallel-plate type plasma systems.

Any of the various gases conventionally used in plasma treatments may be suitable for pretreating the surface, including gases such as oxygen, hydrogen, nitrogen, argon, ammonia, or mixtures thereof. Particularly preferred gases include oxygen and argon. Different gases may be used to modify the surface in different ways. For example, plasma treatment with argon gas will bombard the surface with argon ions, which can clean the surface or make it rougher on an atomic scale, thereby improving its ability to adhere to the hybrid layer. Plasma treatment with oxygen can chemically activate the surface with oxygen-containing functional groups, which can form bonds with the hybrid layer. In order to achieve the desired surface property, various other parameters of the plasma treatment process can be adjusted, including the power, frequency, duration, pressure, or temperature.

In some cases, the surface may be pretreated by disposing an intervening layer between the surface and the hybrid layer. The intervening layer comprises any of the various materials which can serve to improve the interfacial cohesion between the surface and the hybrid layer. For example, suitable materials for use in the intervening layer include silicon nitride, chromium, titanium, a nickel-titanium alloy, or a dielectric material. This layer may be deposited using any of various techniques conventionally used for the deposition of thin films, including chemical vapor deposition, plasma vapor deposition, or sputtering. The thickness of the intervening layer will vary according to the particular application. In some cases, the intervening layer may be a mono-atomic or mono-molecular layer, or have a thickness of up to 50 nm, but other thicknesses are also possible in other cases. The material in the intervening layer may further undergo chemical reactions with materials in the layers or structures that are above or below the intervening layer.

Figure 14:
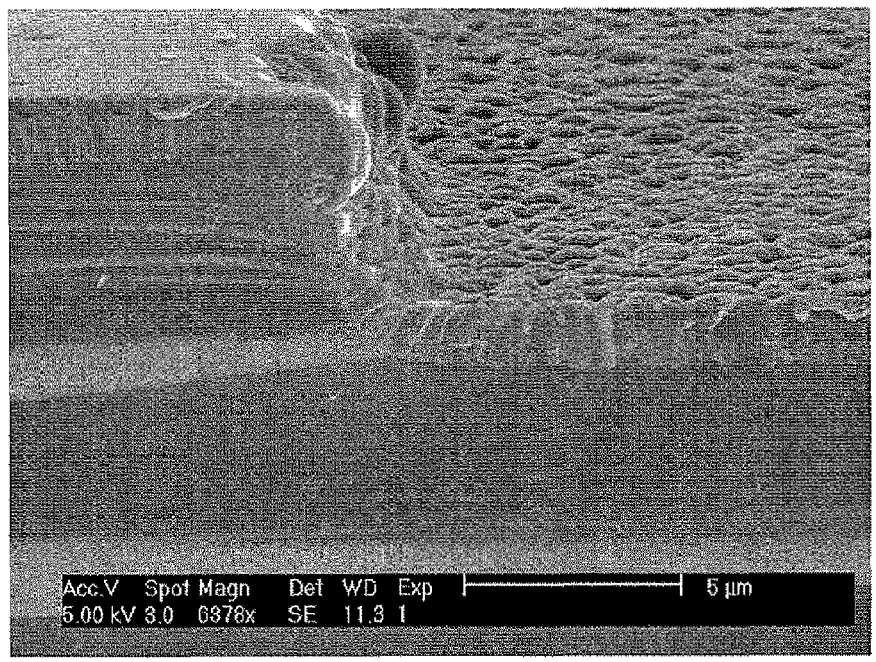
FIG. 14 shows a scanning electron micrograph of a cross-section of a hybrid layer according to another embodiment.

FIG. 14 shows a scanning electron micrograph (SEM) of a cross-section of a hybrid layer deposited onto an etched silicon wafer. The unetched part of the silicon wafer (shown on the left side of FIG. 14 as the raised edge with a 5 μm step height) was covered with an 80 nm film of chromium, which also functioned as the etch mask during the etching of the silicon wafer. The etched portion of the silicon wafer (shown on the right side of FIG. 14) was not pretreated with a chromium film. A hybrid layer was deposited by PE-CVD over both parts of the silicon wafer under the following conditions:

| HMDSO gas flow rate (sccm) | O₂ gas flow rate (sccm) | Pressure (m torr) | RF start power (W) | RF deposition power (W) | Total deposition time (min) | Layer thickness (μm) |
| --- | --- | --- | --- | --- | --- | --- |
| 1.55 | 50 | 110-150 | 60 | 60 | 50* | 2.5 |

*In two intermittent periods of 25 min. each, with cooling between each period.

The average temperature of the silicon wafer substrate, through the heating and cooling cycles of the intermittent deposition process, was greater than 80° C. (with a starting temperature of about 22° C. and an ending temperature of about 160° C.). Over the chromium-treated surface, the hybrid layer had a dense microstructure. However, over the untreated surface, the barrier layer has an irregular, columnar microstructure. Based on the morphological differences, the hybrid layer over the chromium-treated surface (having the dense microstructure) can be expected to be less permeable to moisture and oxygen than the hybrid layer deposited over the untreated surface.

In some cases, the intervening layer may be a multi-layered structure comprising one or more planarizing sublayers and one or more adhesion promoting sublayers. For example, U.S. Pat. No. 6,597,111 (Silvernail et al.) and U.S. Pat. No. 7,187,119 (Weaver) describe barrier layers formed of an alternating series of polymeric planarizing sublayers and high-density sublayers. The polymeric planarizing sublayer comprises a polymeric planarizing material that forms a smooth surface. The high-density sublayer comprises a high-density material (e.g., an inorganic, ceramic, or dielectric material) with sufficiently close atomic spacing such that diffusion of environmental contaminants is hindered. In another example, the intervening layer may comprise multiple alternating layers of spin-coated polymer layers and hybrid layers (deposited in the manner described above); or $SiN_x$ layers and hybrid layers; or spin-coated polymer layers and $SiN_x$ layers.

Figure 15:
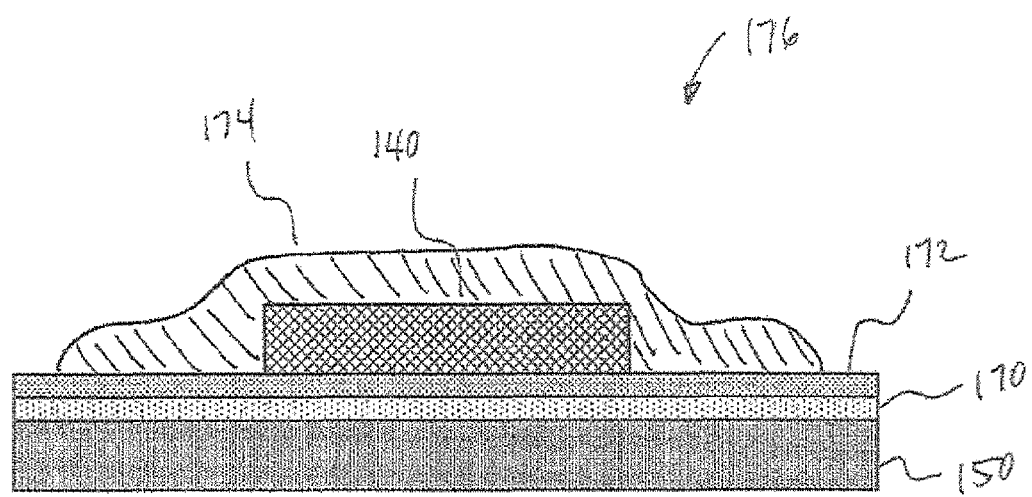
FIG. 15 shows an encapsulated OLED according to another embodiment.

For example, referring to the embodiment shown in FIG. 15, an electronic device 176 comprises a substrate 150 that is coated with a planarizing sublayer 170 of polymeric material. An adhesion-promoting sublayer 172 is disposed on planarizing sublayer 170. The body 140 of an OLED (including the electrodes) is disposed on the surface of adhesion-promoting sublayer 172. A hybrid layer 174 is then deposited over OLED body 140 as a conformal coating. As such, in addition to covering the top of OLED body 140, hybrid layer 174 also extends down the sides of OLED body 140 and contacts the surface of adhesion-promoting sublayer 172. In this way, the adhesion between hybrid layer 174 and adhesion-promoting sublayer 172 can reduce the lateral diffusion of environmental contaminants through the interfacial region.

As explained above, the deposition conditions may be varied to provide hybrid layers with different structures, compositions, and/or properties, including its permeability to environmental contaminants and its ability to adhere to the surface on which the hybrid layer is deposited. In some cases, the deposition temperature (e.g., through heating and cooling of the substrate) may be controlled to reduce the permeability of the hybrid layer. FIGS. 16A and 16B show scanning electron micrographs (SEM) of a cross-section of a hybrid layer deposited onto an etched silicon wafer. The unetched part of the silicon wafer (shown on the right sides of FIGS. 16A and 16B as the raised edge) was covered with a thin film of chromium, which also functioned as the etch mask during the etching of the silicon wafer. The etched part of the silicon wafer (shown on the left sides of FIGS. 16A and 16B) was not pretreated with a thin chromium film. A hybrid layer was deposited over both parts of the silicon wafer by PE-CVD under the following conditions:

| HMDSO gas flow rate (sccm) | O₂ gas flow rate (sccm) | Pressure (mTorr) | RF start power (W) | RF deposition power (W) | Total deposition time (min) | Layer thickness (μm) |
| --- | --- | --- | --- | --- | --- | --- |
| 1.25 | 40 | 95-125 | 25 | 50 | 90* | 4 |

*In 16 intermittent periods of 5 min. each, with cooling between each period.

The average temperature of the silicon wafer substrate, through the heating and cooling cycles of the intermittent deposition process, was about 35° C. In an intermittent deposition process, one way to control the deposition temperature is to adjust the number or duration of heating and/or cycles. As such, because this hybrid layer was deposited with heating cycles of shorter duration and with a greater number of cooling cycles, the average deposition temperature was lower than that used in depositing the hybrid layer shown in FIG. 14. As a result, the hybrid layer over both the chromium-treated and bare surfaces of the silicon wafer has an irregular, columnar structure. Also, there is poor coverage over the lateral aspects of the step. Thus, a hybrid layer formed using a higher deposition temperature within a certain range can be expected to have less permeability than a hybrid layer formed using a lower deposition temperature. In some cases, the hybrid layer is deposited under a deposition temperature in the range of 40° C. to 90° C.

In some cases, the deposition power can be controlled to reduce the permeability of the hybrid layer. FIG. 17A shows a scanning electron micrograph (SEM) of a cross-section of a hybrid layer deposited on a bottom emitting OLED stack. The hybrid layer was deposited by PE-CVD under the following conditions:

| HMDSO gas flow rate (sccm) | $O_2$ gas flow rate (sccm) | Pressure (mTorr) | RF start power (W) | RF deposition power (W) | Total deposition time (min) | Layer thickness (μm) |
|---|---|---|---|---|---|---|
| 1.25 | 40 | variable* | 24 | 50 | 115* | 5 |

*In intermittent periods of: 9 min. at 100 mTorr, followed by 8 times 6 min. at 100 mTorr, followed by 8 min. at 130 mTorr, followed by 10 min. at 150 mTorr, followed by 9 min. at 125 mTorr, followed by 7 min. at 150 mTorr, followed by 8 min. at 125 mTorr, followed by 10 min. at 150 mTorr, followed by 8 min. at 125 mTorr, and followed by 9 min. at 125 mTorr.

Higher deposition power is believed enhance monomer fragmentation. Thus, by gradually increasing the power from 24 W to 50 W, each subsequent stratum in the hybrid layer is observed to take on a more oxide-like character and less of polymer-like character. In FIG. 17A, the stratum of the hybrid layer closest to the surface (deposited under lower power) has a porous, polymer-like microstructure, whereas the stratum farther from the surface (deposited under a higher power) has a more dense, oxide-like microstructure.

FIG. 17B shows a scanning electron micrograph (SEM) of a cross-section of another hybrid layer, which was deposited by PE-CVD on a top emitting OLED stack under the following conditions:

| HMDSO gas flow rate (sccm) | $O_2$ gas flow rate (sccm) | Pressure (mTorr) | RF start power (W) | RF deposition power (W) | Total deposition time (min) | Layer thickness (μm) |
|---|---|---|---|---|---|---|
| 1.55 | 50 | 110-150 | 55 | 60 | 135* | 6 |

*In 12 intermittent periods of 10 mins. each, with cooling between each period.

In comparison to the hybrid layer shown in FIG. 17A, a higher deposition power was used in depositing the hybrid layer shown in FIG. 17B. As a result, this hybrid layer has a microstructure that is denser than that of the hybrid layer shown in FIG. 17A. Thus, a hybrid layer formed using a higher deposition power can be expected to have less permeability than a hybrid layer formed using a lower deposition power.

When two dissimilar materials are placed in intimate contact with another, such contact may give rise to stresses, particularly at the interface between the two materials. Thus, in certain embodiments, the residual internal stress of the hybrid layer may be controlled to reduce the incidence of stress-induced defects in the hybrid layer, such as cracking, voids, buckling, or delamination. One way to control the internal stress in the hybrid layer is to adjust the deposition conditions.

Figure 18:
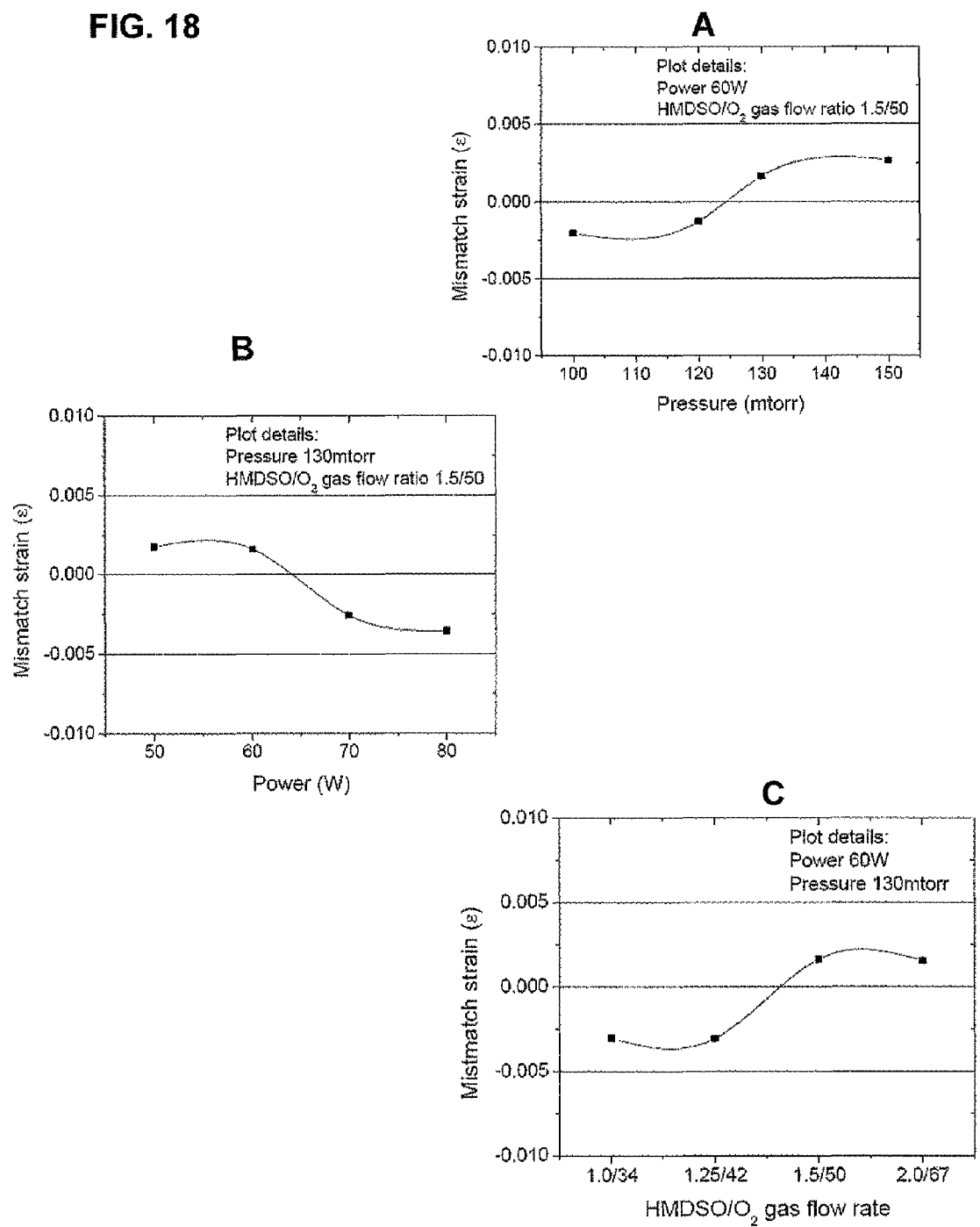
FIGS. 18A-C show plots of strain mismatches between polyimide substrates and various hybrid layers deposited thereon.

FIGS. 18A-C show the strain mismatch between 25 μm thick Kapton-E polyimide substrates and various hybrid layers (of 320-600 nm thickness) deposited thereon under different conditions. A positive mismatch corresponds to tensile stress in the hybrid layer and a negative mismatch corresponds to compressive stress in the hybrid layer. Referring to FIG. 18A, increasing the deposition pressure from 100 mTorr to 150 mTorr, with deposition power and gas flow rate being held constant, results in greater tensile stress being created in the hybrid layer. Referring to FIG. 18B, increasing the deposition power from 50 W to 80 W, with deposition pressure and gas flow rate being held constant, results in greater compressive stress being created in the hybrid layer. Referring to FIG. 18C, increasing the HMDSO/$O_2$ gas flow rate from 1.0/34 to 2.0/67, with deposition pressure and power being held constant, results in greater tensile stress being created in the hybrid layer.

These results indicate that the internal stress in the hybrid layer can be tuned by varying the deposition parameters. These results also indicate that there is an optimum set of deposition parameters in which the stress in the hybrid layer can be minimized. For example, one deposition parameter may be tuned to create a compressive stress in the hybrid layer while another deposition parameter may be tuned to create a matching tensile stress in the hybrid layer, resulting in a residual net stress that is zero or close to zero. In instances where a multi-layered coating comprises a plurality of hybrid layers, it is also possible to individually tune the stress in each hybrid layer to control the overall stress in the coating. For example, each hybrid layer may be tuned to balance the overall stress in the coating, or to gradually increase the amount of stress in the hybrid layer with increasing distance from the surface.

Two dissimilar materials placed in intimate contact with another may also give rise to residual stresses resulting from different coefficients of thermal expansions (CTE). Thus, in certain embodiments, the composition of the hybrid layer can be tuned to more closely match the coefficient of thermal expansion of an adjacent structure (e.g., a polymer substrate or metal/inorganic oxide interconnects). For example, the CTE of the hybrid layer can be increased or decreased by adjusting the relative ratio of polymeric to non-polymeric material in order to more closely match the CTE of the substrate.

In certain embodiments, where an electronic device is disposed on a surface serving as a foundation (i.e., a foundation surface), the hybrid layer and/or surface may further comprise an edge barrier to reduce the penetration of environmental contaminants (e.g., moisture or oxygen) by lateral diffusion, either through the foundation material itself or through the interface between the foundation surface and the hybrid layer. The foundation may be formed of any of the materials described herein or any other material known to be used for disposing an electronic device thereon (e.g., materials used in planarization and/or insulation layers on metal foil substrates or barrier-coated plastic substrates). Any of the various types of edge barriers as known in the art are suitable for use in the present invention. In some cases, the edge barrier is constructed by bonding the hybrid layer to the foundation surface at areas peripherally adjacent the electronic device. The bonding may be achieved by applying heat sealing or an adhesive (e.g., epoxy-based adhesives) to these areas.

In some cases, the edge barrier may be end caps that extend from a top surface of the electronic device, downwardly along the lateral sides of the electronic device, and into contact with the foundation surface. One type of end cap which may be suitable for use in the present invention is described in U.S. Pat. No. 7,002,294 (Forrest et al.). The end caps may be made of any material that can protect the electronic device from the lateral ingress of environmental contaminants, including high density ceramic materials (e.g., silicon dioxide) or metallic materials.

Figure 19:
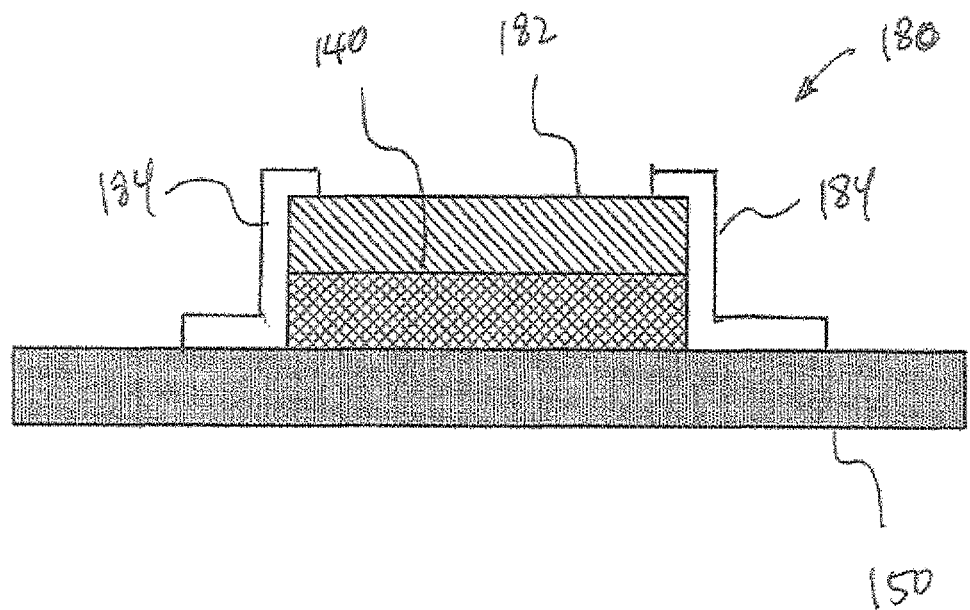
FIG. 19 shows an encapsulated OLED according to another embodiment.

For example, referring to the embodiment shown in FIG. 19, an encapsulated OLED 180 comprises a substrate 150 with the body 140 of the OLED (including the electrodes) disposed thereon. A hybrid layer 182 is deposited on OLED body 140. End caps 184 are disposed around hybrid layer 182 and OLED body 140 so as to extend from a top surface of hybrid layer 182, down the lateral aspects of OLED body 140, and into contact with the surface of substrate 150. End caps 184 function to reduce the lateral ingress of environmental contaminants through the lateral surfaces or edges of OLED 180.

In some cases, an edge bather may be formed by creating one or more discontinuities into the foundation surface in areas peripherally adjacent the electronic device. These discontinuities can serve as a barrier against the penetration of environmental contaminants by any of various mechanisms, including increasing the path length for the lateral ingress of environmental contaminants, or where the foundation material serves as a conduit for the ingress of environmental contaminants, forming a break in the conduit. As used herein, the term "discontinuities" refers to discrete voids (e.g., trenches, grooves, slots, cracks, breaks, gaps, holes, perforations) created in the foundation surface by removal or deposition of material using techniques that control the size, shape, and location of the voids. For example, such techniques include direct-write etching using energetic beams (e.g., laser, ion, or electron), micromachining, microdrilling, lithographic processes, or masked-deposition of the foundation material with selective masking over the areas where the voids are to be created.

Figure 20:
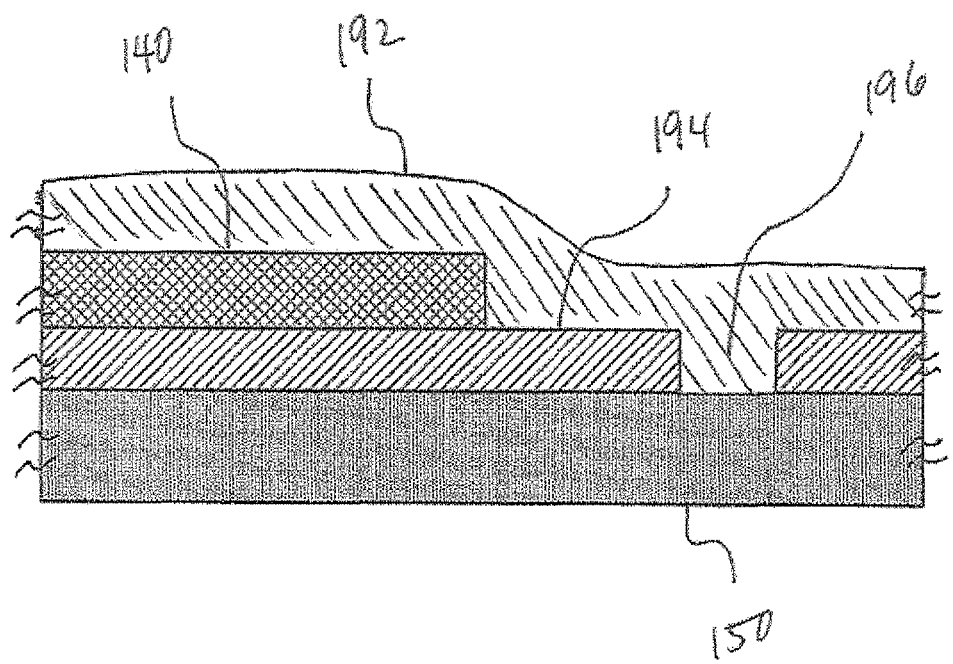
FIG. 20 shows an encapsulated OLED according to another embodiment.

For example, referring to the embodiment shown in FIG. 20, a substrate 150 is coated with a polyimide film 194. Polyimide film 194 serves as a foundation surface upon which the body 140 of an OLED (including the electrodes) is disposed. Etched into polyimide film 194 is a trench 196 that surrounds the periphery of OLED body 140. Alternatively, trench 196 may be formed by selectively masking the area during the deposition of polyimide film 194. Trench 196 extends through the full thickness of polyimide film 194. OLED body 140 is covered with a hybrid layer 192, which covers the top of OLED body 194, as well as extending down the sides of OLED body 140, to the foundation surface. On the foundation surface, hybrid layer 192 also fills-in trench 196 to prevent the polyimide film from serving as a conduit for the lateral ingress of environmental contaminants.

Figure 22:
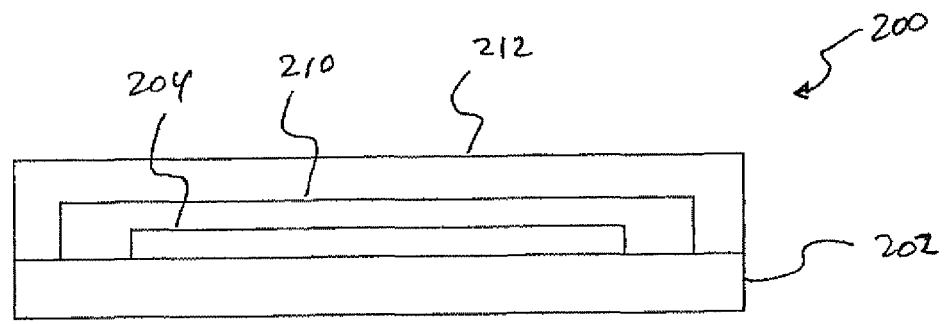
FIG. 22 shows an encapsulated OLED according to another embodiment.

Various other types of edge barriers are also possible. In certain embodiments, the edge barrier may be another barrier coating that extends over the edges of the hybrid layer. For example, referring to the embodiment shown in FIG. 22, an electronic device 200 comprises an OLED body 204 (comprising a stack of organic layers) mounted on a substrate 202. OLED body 204 is coated with a hybrid layer 210 that extends over the edges of OLED body 204 and comes into contact with the surface of substrate 202. A bather coating 212 is deposited over hybrid layer 210, extending over the edges of hybrid layer 210 to impede the lateral ingress of environmental contaminants.

The bather coating used to cover the hybrid layer may itself be a hybrid layer of the present invention. For example, in an alternate embodiment of electronic device 200 in FIG. 22, bather coating 212 is another hybrid layer that is deposited after hybrid layer 210 is deposited. In other cases, the barrier coating may be any barrier coating conventionally used in protecting electronic devices. As such, in some cases, the barrier coating can be relatively thick or hard as compared to the hybrid layer. In some cases, the barrier coating is sufficiently thick and/or hard to be capable of providing the electronic device with protection from mechanical damage, even though it may not be as effective as the hybrid layer in providing protection from the ingress of environmental contaminants.

Figure 23:
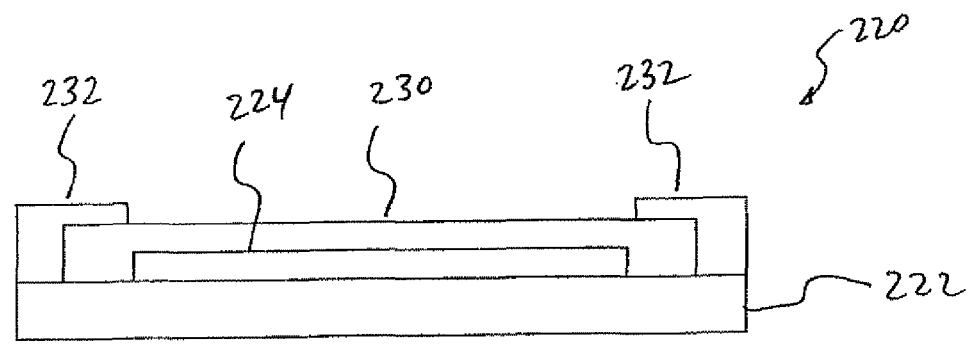
FIG. 23 shows an encapsulated OLED according to another embodiment.

Also, the barrier coating over the hybrid layer does not necessarily have to completely cover the hybrid layer. For example, referring to the embodiment shown in FIG. 23, an electronic device 220 comprises an OLED body 224 (comprising a stack of organic layers) mounted on a substrate 222. OLED body 224 is coated with a hybrid layer 230 that extends over the edges of OLED body 224 and comes into contact with the surface of substrate 222. A barrier coating 232 is mask-deposited, or deposited and then patterned onto hybrid layer 230 such that only the edges of hybrid layer 230 are covered. In this embodiment, because barrier coating 232 does not cover over OLED body 224, bather coating 232 does not have to be transparent. For example, barrier coating 232 may be made of a metal or may be relatively thick.

Figure 24:
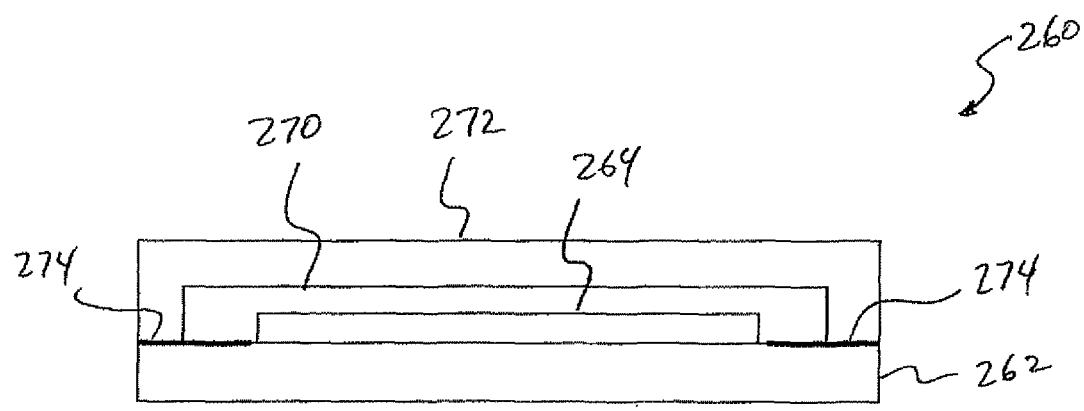
FIG. 24 shows an encapsulated OLED according to another embodiment.

In some cases, the edge bather may be combined with the above-described intervening layer that serves to improve the interfacial cohesion between the surface of the substrate with the hybrid layer and the edge barrier. For example, referring to the embodiment shown in FIG. 24, an electronic device 260 comprises an OLED body 264 (comprising a stack of organic layers) mounted on a substrate 262. Around the periphery of OLED body 264 is an intervening layer 274. OLED body 264 is coated with a hybrid layer 270 that extends over the edges of OLED body 264 and comes into contact with intervening layer 274. A barrier coating 272 is deposited over hybrid layer 270, wherein barrier coating 272 extends over the edges of hybrid layer 270 and comes into contact with intervening layer 274. In this configuration, intervening layer 274 serves to adhere hybrid layer 270 and barrier coating 272 to substrate 262.

Figure 31:
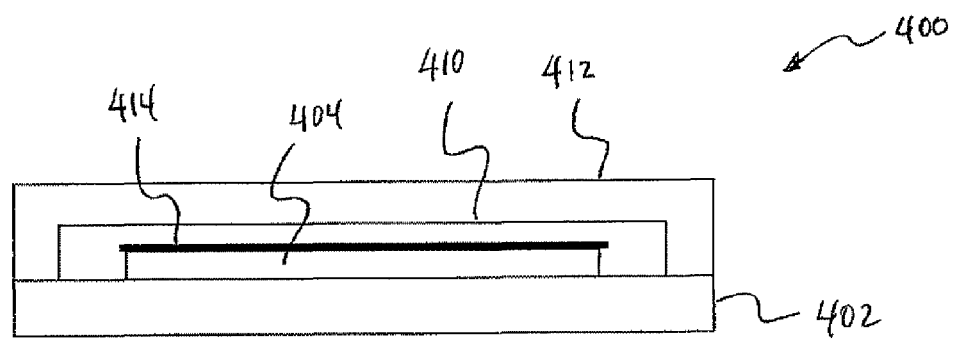
FIG. 31 shows an encapsulated OLED according to another embodiment.

In certain embodiments, an intervening layer is used to improve the interfacial cohesion between the top electrode of an OLED body (e.g., the cathode) and an overlying hybrid layer. For example, referring to the embodiment shown in FIG. 31, an electronic device 400 comprises an OLED body 404 (comprising a stack of organic layers) mounted on a substrate 402. OLED body 404 is coated with a hybrid layer 410 that extends over the edges of OLED body 404 and comes into contact with the surface of substrate 402. A barrier coating 412 is deposited over hybrid layer 410 and extending over the edges of hybrid layer 410 to impede the lateral ingress of environmental contaminants. An intervening layer 414 is deposited directly onto the top electrode of OLED body 404 using a mask. In this case, intervening layer 414 serves to adhere the top surface of OLED body 404 to the overlying hybrid layer 410.

Figure 25:
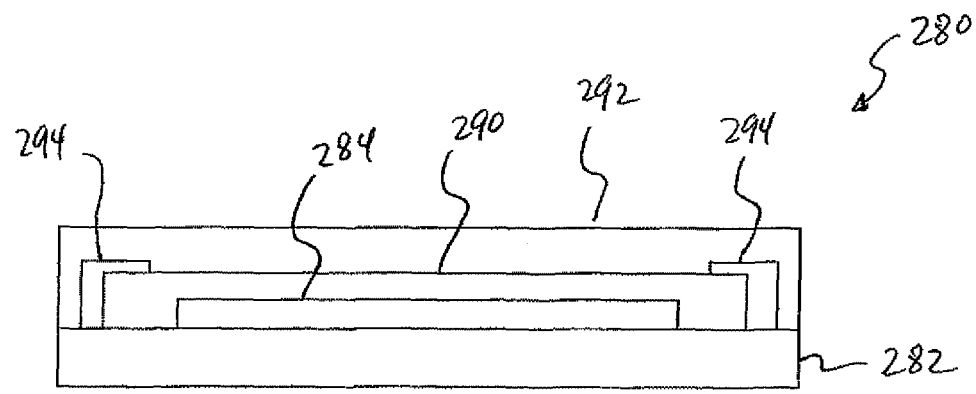
FIG. 25 shows an encapsulated OLED according to another embodiment.

In certain embodiments, the edge barrier comprises a desiccant material, which may be any of various desiccant materials known in the art (e.g., calcium chloride, silicon dioxide, barium oxide, calcium oxide, titanium dioxide, etc.). Such an edge barrier can have any of various structures (e.g., layers, dams, rings, etc.) and arrangements known in the art with respect to desiccants for use in organic electronic devices, including OLEDs. The desiccant material used in the edge barrier can be useful in absorbing moisture that diffuses in from the edges of the hybrid layer. For example, referring to the embodiment shown in FIG. 25, an electronic device 280 comprises an OLED body 284 (comprising a stack of organic layers) mounted on a substrate 282. OLED body 284 is coated with a hybrid layer 290 that extends over the edges of OLED body 284 and comes into contact with the surface of substrate 282. A desiccant ring layer 294 is placed around the edge of hybrid layer 290. A barrier coating 292 is then deposited over these components, wherein barrier coating 292 extends over desiccant ring layer 294 and comes into contact with the surface of substrate 282.

Figure 26:
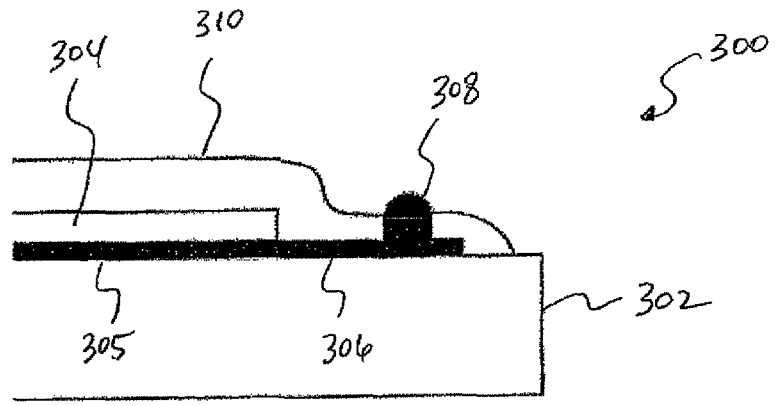
FIG. 26 shows an encapsulated OLED according to another embodiment.

Another potential pathway for the lateral ingress of environmental contaminants is around the interconnecting leads (e.g., electrode strips or wires) that connect to the electrodes (i.e., the anode or cathode) on the organic electronic devices. In some cases, the hybrid layer extends over the edges of the interconnecting leads. For example, referring to FIG. 26, an electronic device 300 comprises an OLED body 304 (comprising a stack of organic layers) mounted on a substrate 302. OLED body 304 includes an electrode 305, from which an interconnecting lead 306 extends outward from OLED body 304. Interconnecting lead 306 does not extend to the edge of substrate 302, however. A hybrid layer 310 is then deposited over these components such that hybrid layer 310 extends over the edges of interconnecting lead 306 and comes into contact with the surface of substrate 302 near its outer perimeter.

Near its lateral edge, interconnecting lead 306 has a post 308, which is made of an electrically-conductive non-corroding metal (e.g., copper or gold). Post 308 protrudes through an opening in hybrid layer 310 and serves as a contact pad for making an electrical connection with interconnecting lead 306. This post 308 and the opening in hybrid layer 310 through which post 308 protrudes may be created using any of various techniques known in integrated circuit fabrication. For example, the opening in hybrid layer 310 may be created by shadow masking during the formation of hybrid layer 310, and post 308 may be created by electroplating techniques.

Figure 33:
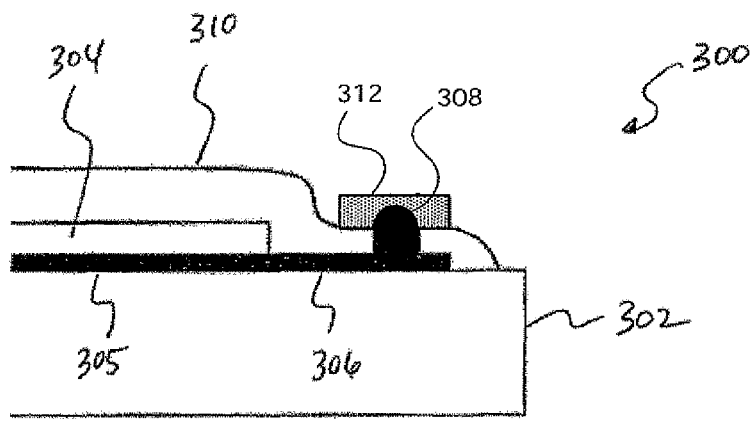
FIG. 33 shows an encapsulated OLED according to another embodiment.

In this case, because the edge of interconnecting lead 306 is covered by hybrid layer 310, lateral diffusion of environmental contaminants around interconnecting lead 306 is impeded. Also, post 308 functions as a dam that further impedes the ingress of environmental contaminants and lengthens the diffusion path. In an alternate embodiment of electronic device 300, another hybrid layer is disposed between the substrate and OLED body 304 such that OLED body 304 is sandwiched between the two hybrid layers. In another alternate embodiment of electronic device 300, the substrate is a metal foil and a planarizing layer is disposed between the substrate and OLED body 304 such that OLED body 304 is sandwiched between hybrid layer 310 and the planarizing layer. In yet another alternate embodiment of electronic device 300, the substrate is a polymer substrate and a passivation layer is disposed between the substrate and OLED body 304 such that OLED body 304 is sandwiched between hybrid layer 310 and the passivation layer. As shown in FIG. 33, in another alternate embodiment of electronic device 300, the outside portion of post 308 has a knob 312 that extends outward along the surface of hybrid layer 310 to further lengthen the diffusion path.

Where the substrate is a metal substrate (e.g., a metal foil), a polymer layer is often used to planarize the surface of the substrate. However, this polymer layer can serve as a conduit for the diffusion of environmental contaminants. Thus, in certain embodiments, where a polymer planarizing layer is used, the polymer planarizing layer does not extend to the edge of the substrate. With this configuration, diffusion of environmental contaminants through the polymer planarizing layer is impeded. A polymer planarizing layer can be fashioned in this manner by any of various techniques, including masked deposition of the polymer planarizing layer or by removal of the edge portions of the polymer planarizing layer after its deposition.

Figure 27:
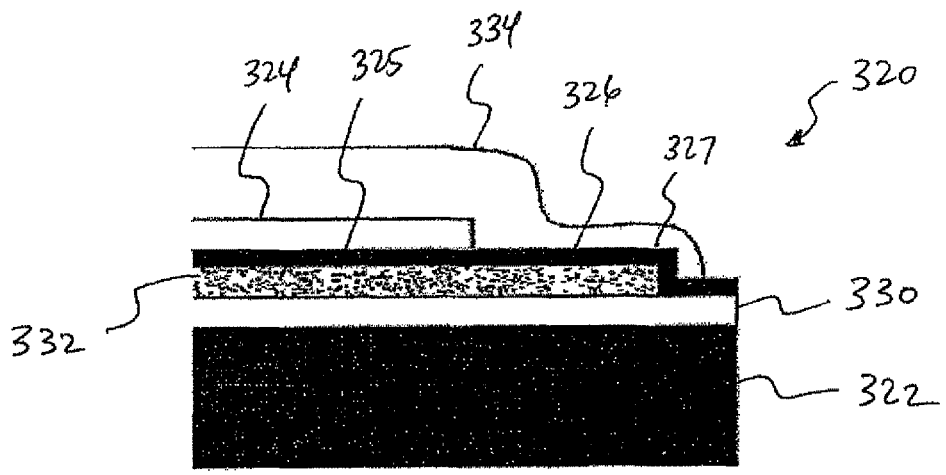
FIG. 27 shows an encapsulated OLED according to another embodiment.

For example, referring to the embodiment shown in FIG. 27, an electronic device 320 comprises a metal foil substrate 322, onto which a first hybrid layer 330 is deposited. A polymer planarizing layer 332 is deposited over first hybrid layer 330, wherein the edge portions of polymer planarizing layer 332 are removed so that polymer planarizing layer 332 does not extend to the edge of metal foil substrate 322. An OLED body 324 (comprising a stack of organic layers) having an electrode 325 is formed on polymer planarizing layer 332. An interconnecting lead 326 extends from electrode 325 to the edge of metal foil substrate 322. Interconnecting lead 326 has a step portion 327 where it crosses over the edge of polymer planarizing layer 332 and contacts the surface of first hybrid layer 330. A second hybrid layer 334 is then deposited over these components, including interconnecting lead 326 (but leaving a small portion uncovered for a contact pad).

Figure 28:
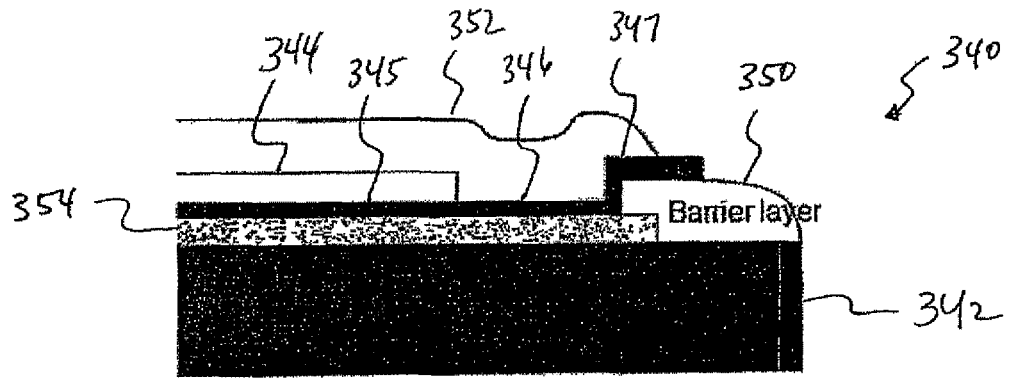
FIG. 28 shows an encapsulated OLED according to another embodiment.

In another example, referring to the embodiment shown in FIG. 28, an electronic device 340 comprises a metal foil substrate 342, onto which a polymer planarizing layer 354 is deposited. The edge portions of polymer planarizing layer 354 are removed and a first hybrid layer 350 is deposited over the edge of polymer planarizing layer 354. An OLED body 344 (comprising a stack of organic layers) having an electrode 345 is formed over polymer planarizing layer 354. An interconnecting lead 346 extends from electrode 345 and has a step portion 347 where it crosses over first hybrid layer 350. A second hybrid layer 352 is then deposited over these components, including interconnecting lead 346 (but leaving a small portion uncovered for a contact pad).

It is also notable that the above embodiments of FIGS. 27 and 28 illustrate that the interconnecting leads can be structured in such a way to lengthen the diffusion path or otherwise impede the lateral ingress of environmental contaminants. Such configurations include interconnecting leads that have a non-smooth surface, that have a non-planar configuration, or that take a tortuous path. In the above examples, the stepped portions of the interconnecting leads serve to lengthen the diffusion path for environmental contaminants.

Figure 29:
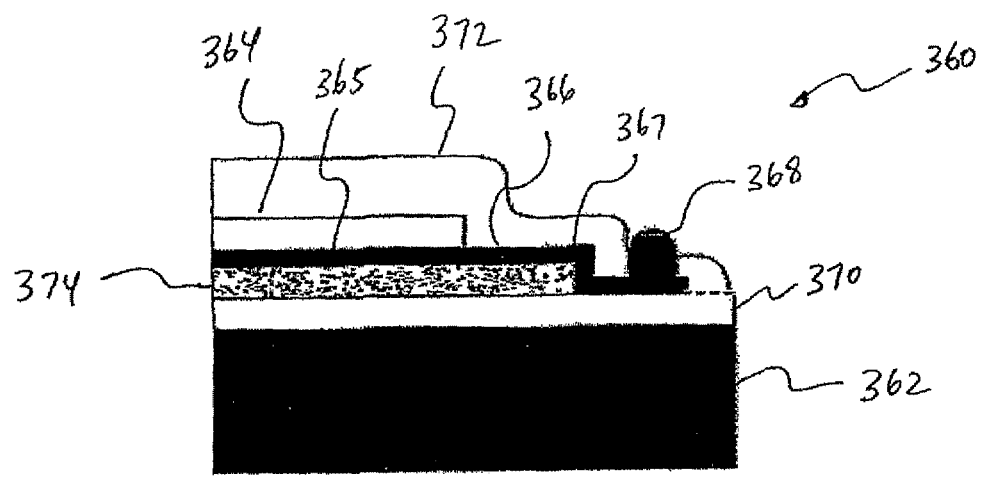
FIG. 29 shows an encapsulated OLED according to another embodiment.

In some cases, various of the above techniques for impeding the lateral ingress of environmental contaminants may be combined. For example, referring to the embodiment shown in FIG. 29, an electronic device 360 comprises a metal foil substrate 362, onto which a first hybrid layer 370 is deposited. A polymer planarizing layer 374 is then deposited onto first hybrid layer 370, with the edge portions of polymer planarizing layer 374 being removed. An OLED body 364 (comprising a stack of organic layers) having an electrode 365 is formed on polymer planarizing layer 374. An interconnecting lead 366 extends outward from electrode 365, but stops short of the edge of metal foil substrate 362. Interconnecting lead 366 has a step portion 367 where it crosses over the edge of polymer planarizing layer 374. A second hybrid layer 372 is then deposited over these components, including the edge of interconnecting lead 366. Near its lateral edge, interconnecting lead 366 has a post 368, which is made of an electrically-conductive material, and which protrudes through an opening in second hybrid layer 372 such that post 368 can serve as a contact pad.

Figure 30:
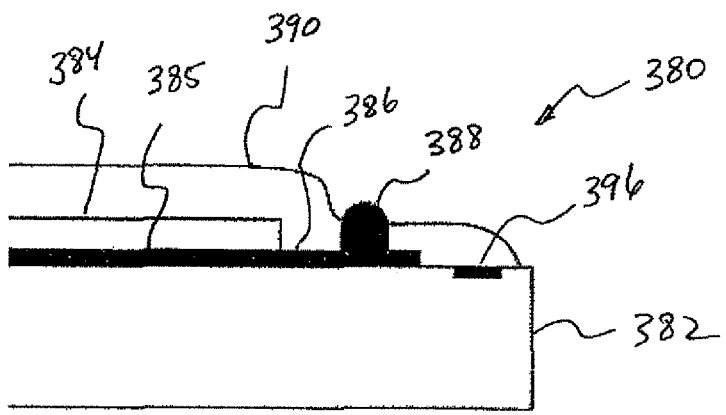
FIG. 30 shows an encapsulated OLED according to another embodiment.

In another example, referring to the embodiment shown in FIG. 30, an electronic device 380 comprises an OLED body 384 (comprising a stack of organic layers) mounted on a glass substrate 382. OLED body 384 includes an electrode 385, from which an interconnecting lead 386 extends outward from OLED body 384. Interconnecting lead 386 does not extend to the edge of substrate 382, however. Substrate 382 is patterned at its periphery and filled with a desiccant 396, which can be deposited in various ways, including by evaporation, spin-on, sol-gel process, or lamination. A hybrid layer 390 is deposited over these components, including desiccant 396. Hybrid layer 390 has an opening through which a post 388 on interconnecting lead 386 protrudes. In this configuration, desiccant 396 will absorb any moisture that enters through the edge of hybrid layer 390. Further, because the edge of interconnecting lead 386 is covered by hybrid layer 390, lateral diffusion of environmental contaminants around interconnecting lead 386 is impeded. Also, post 388 functions as a dam that further impedes the ingress environmental contaminants and lengthens the diffusion path.

In an alternate embodiment of electronic device 380, the substrate is a metal foil with a planarizing layer positioned between the OLED body and the metal foil substrate. In this case, the planarizing layer is patterned at its periphery and filled with the desiccant. In another alternate embodiment of electronic device 380, the substrate is a polymer substrate having a passivation layer positioned between the OLED body and the substrate. In this case, the passivation layer is patterned at its periphery and filled with the desiccant.

Some OLEDs use a grid on the bottom electrode to define active pixel areas. The grid may be formed of an organic material (e.g. photoresist) or inorganic material (e.g., silicon nitride). However, the grid may also serve as a conduit for the lateral diffusion of moisture and/or oxygen. To impede this ingress of moisture and/or oxygen, in certain embodiments, the grid material may be selected for its ability to resist the conduction of moisture or oxygen, or the grid may be removed entirely. Also, the grid may be fashioned to have discontinuities that can impede the diffusion of environmental contaminants by providing a break in the conduit. In some cases, the hybrid layer may penetrate into these discontinuities to further impede the diffusion of environmental contaminants.

Figure 32:
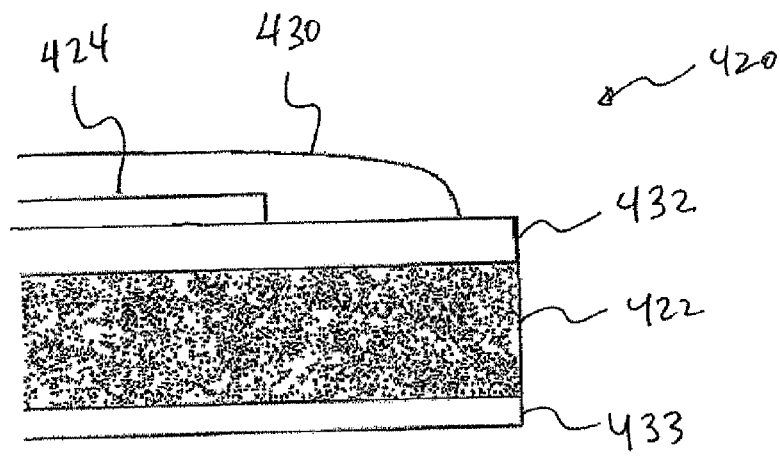
FIG. 32 shows an encapsulated OLED according to another embodiment.

In certain embodiments, the substrate is a polymer substrate. In such cases, the polymeric material in the substrate can become a conduit for the diffusion of environmental contaminants. As such, hybrid layers of the present invention can be used to impede the diffusion of environmental contaminants into the substrate and/or into the organic device body. For example, referring to the embodiment shown in FIG. 32, an electronic device 420 comprises a polymer substrate 422 which is covered on both its top and bottom surfaces with hybrid layers 432 and 433, which serve as passivation layers. An OLED body 424 is mounted on passivation layer 432. Another hybrid layer 430 is then deposited over OLED body 424 and passivation layer 432. In this embodiment, hybrid layer 432 serves to impede the diffusion of environmental contaminants that may travel through polymer substrate 422. Furthermore, this embodiment may be combined with any of the various features described for any of the above embodiments, including the interconnecting lead described in FIG. 26 and/or the desiccant described in FIG. 30.

Furthermore, in some cases, the entire substrate may be encapsulated within a hybrid layer, including the sides and bottom of the substrate. Furthermore, in some cases, the substrate functions as a desiccant to absorb any moisture that enters the electronic device. The substrate can be made to function as a desiccant in various ways, including degassing it before encapsulation and/or by mixing a desiccant into the substrate material.

During deposition, hybrid layers have been observed to extend to regions that do not directly face the plasma, such as the edges of the substrate and even underneath the substrate. This peripheral extension of the hybrid layer may be due to the diffusion of long-lived active species in the plasma or diffusion along the surface. As such, in certain embodiments, a hybrid layer over an organic electronic device may extend laterally and cover over the edges of the substrate, and in some cases, at least a portion of the underside of the substrate as well. In addition to reducing the lateral diffusion of environmental contaminants, hybrid layers serving as an edge barrier in this manner can also allow for the functional organic body to extend further towards the edge of the substrate, thus allowing for an increase in the active device area.

Figure 34:
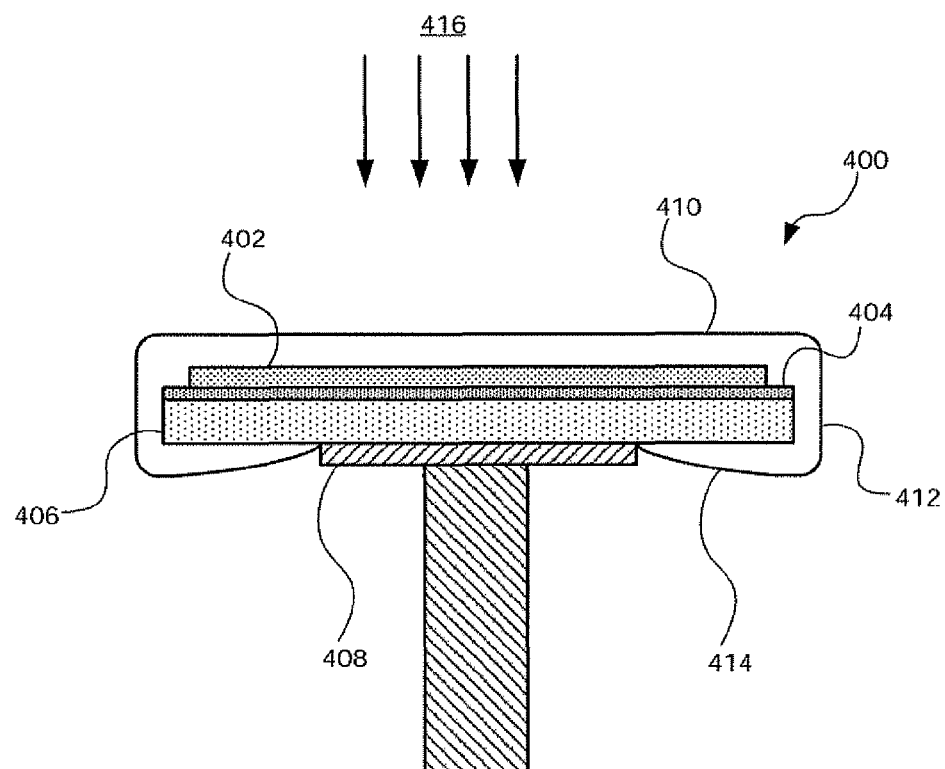
FIG. 34 shows an OLED held on a substrate holder while being coated with a hybrid layer.

For example, FIG. 34 shows an OLED 400 comprising a metal substrate 406 and a polymer planarizing layer 404 to planarize the surface of metal substrate 406. A functional organic body 402 (comprising a stack of organic layers) is formed on planarizing layer 404. To deposit a hybrid layer, OLED 400 is placed inside a deposition reaction chamber and held by a substrate holder 408. During the deposition process, the top surface of OLED 400, which faces the plasma 416, becomes coated with hybrid layer 410. As the deposition process continues, some of the active species in plasma 416 survive long enough to diffuse to the edges of OLED 400 to form side portions 412 of hybrid layer 410. Side portions 412 cover the lateral edges of OLED 400, including the lateral edges of substrate 406 and planarizing layer 404. Some of the active species also diffuse to the underside of substrate 406. Because substrate holder 408 has a smaller area than substrate 406, the active species form underside portions 414 of hybrid layer 410 on the underside areas of substrate 406 that are not masked by substrate holder 408. In an alternate embodiment, where substrate holder 408 masks the entire underside of substrate 406, hybrid layer 410 has side portions 412, but not underside portions 414.

Figure 35A:
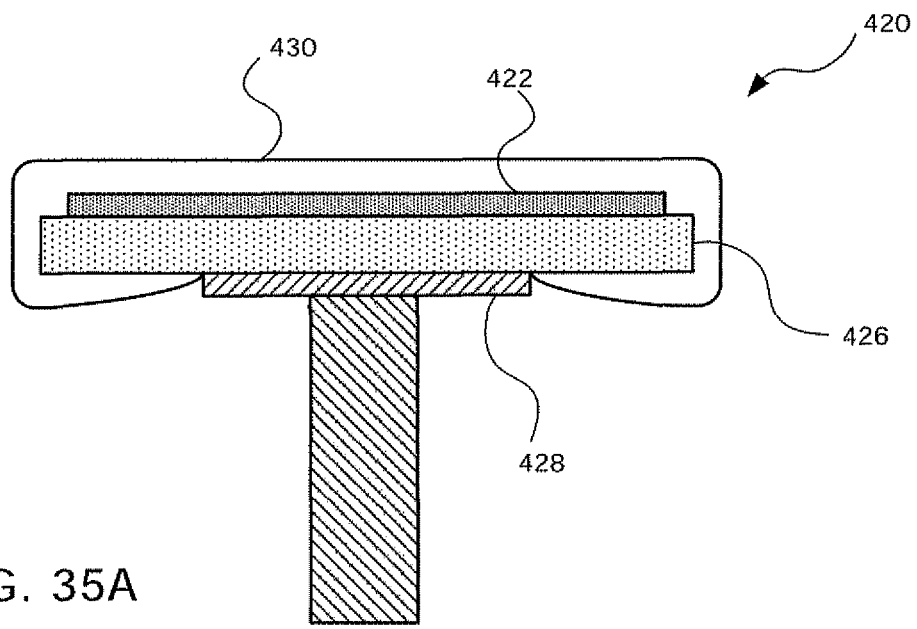
FIGS. 35A-35C show a method for coating an OLED with a hybrid layer.

In certain embodiments, this peripheral extension of the hybrid layer during deposition can allow for complete coverage of the underside of the substrate. For example, FIGS. 35A-35C demonstrate a process by which complete encapsulation of an OLED may be achieved. FIG. 35A shows an OLED 420 comprising a polymer substrate 426 and a functional organic body 422 formed thereon. In a reaction chamber, while OLED 420 is held by a substrate holder 428, functional organic body 422 is coated with a first hybrid layer 430. By the process described above, diffusion of the active species in the plasma results in the formation of side portions of hybrid layer 430 that cover over the lateral sides of OLED 420, including the lateral sides of substrate 426. There is also partial coverage of the underside of substrate 426 (i.e., over the area not masked by substrate holder 428).

Figure 35B:
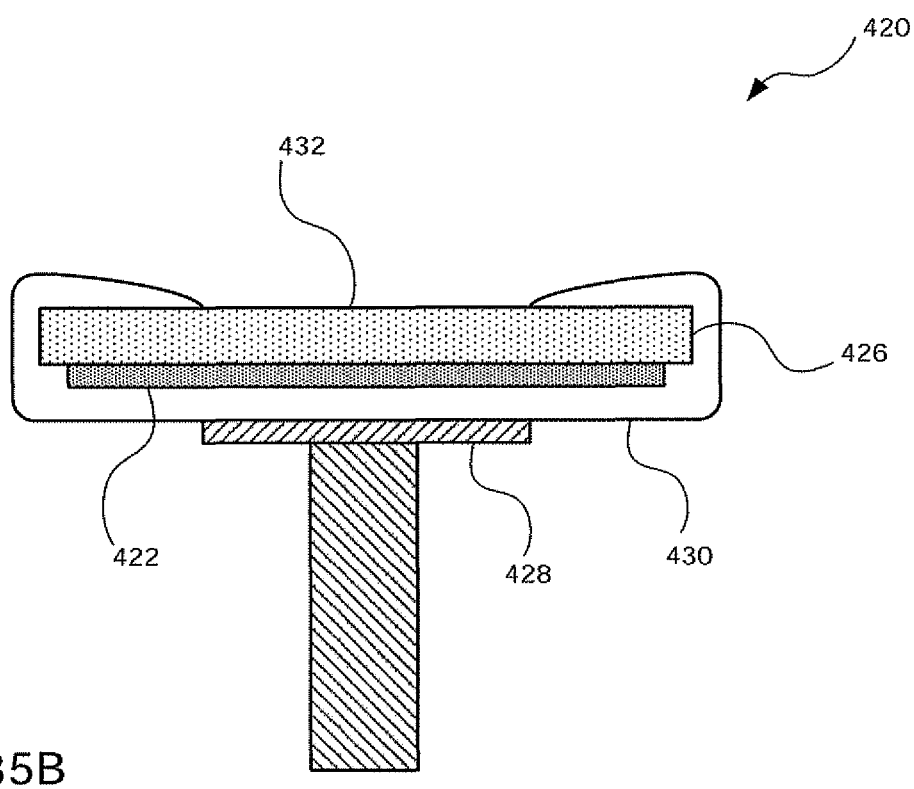
Figure 35C:
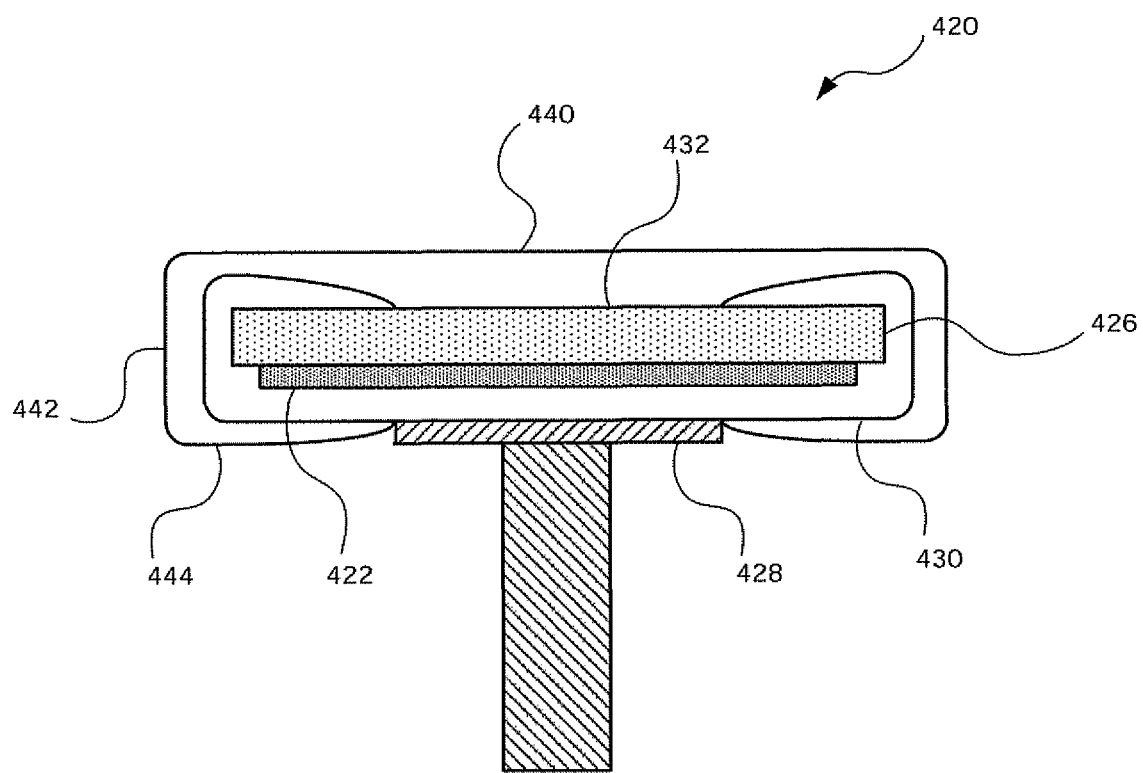

Referring to FIG. 35B, OLED 420 is then inverted on substrate holder 428 such that OLED 420 is held on substrate holder 428 by its top surface and the deposition process is repeated. In this inverted position, the underside 432 of substrate 426 is made to face the plasma. As such, as shown in FIG. 35C, previously exposed portions of the underside 432 of substrate 426 are coated with a second hybrid layer 440. This second hybrid layer 440 also extends laterally to cover the lateral sides (by side portions 442) of OLED 420 and a portion of the top side of OLED 420 (by top portion 444). As a result, OLED 420, including substrate 426, is completely encapsulated within hybrid layers 440 and 430. The composition of hybrid layers 440 and 430 may be same or different.

Figure 36:
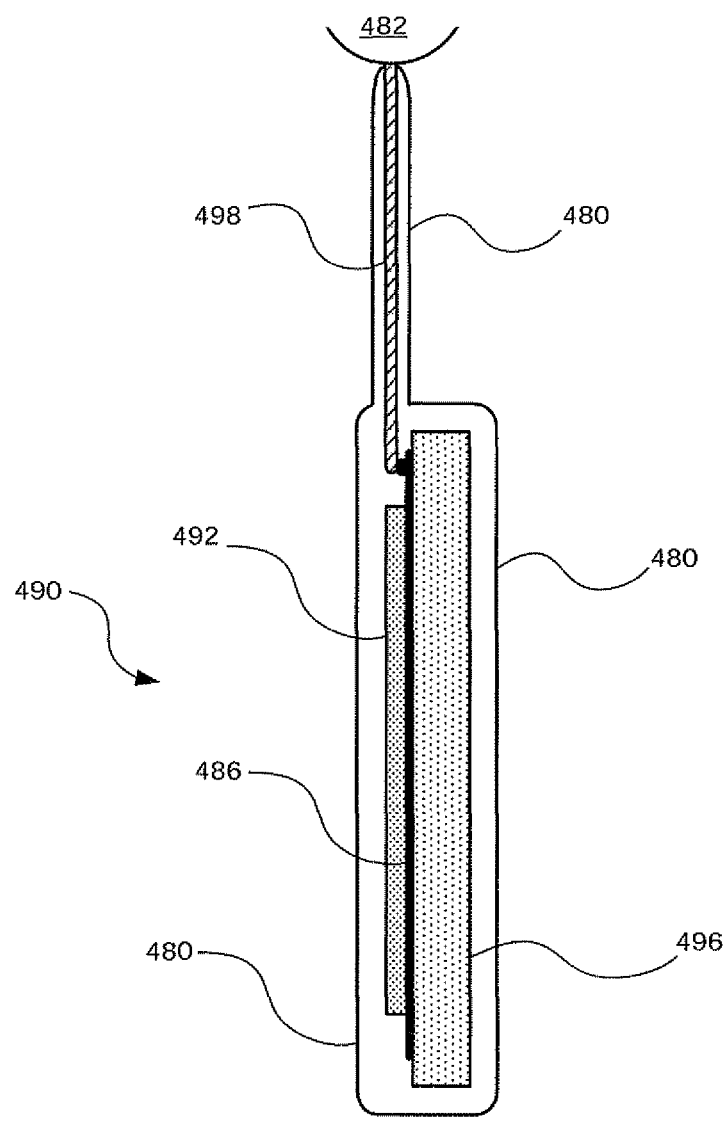
FIG. 36 shows another method for coating an OLED with a hybrid layer.

FIG. 36 demonstrates another process to provide more coverage of the underside of the substrate and/or to coat a connecting lead that connects with the organic electronic device. FIG. 36 shows an OLED 490 comprising a polymer substrate 496 and a functional organic body 492 formed thereon. OLED 490 also includes an electrode 486 electrically connected to a connecting lead 498 (e.g., a wire or strip). OLED 490 is held in a deposition chamber by connecting lead 498 that is fixed to attachment point 482. A hybrid layer 480 is then deposited over functional organic body 492. By diffusion of the active species, hybrid layer 480 also covers over the lateral sides of OLED 490 and the underside of substrate 496. Alternatively, because OLED 490 is suspended in the deposition chamber, OLED 490 may be immersed directly in the plasma or between two or more plasmas to coat both the upper side and the underside simultaneously, which could produce a hybrid layer 480 of more uniform thickness.

Because there is no masking of the underside of substrate 496, hybrid layer 480 has more coverage (in this case, complete coverage) of the underside of substrate 496. Also, connecting lead 498 is at least partially coated by hybrid layer 460 as well, which will impede the lateral diffusion of environmental contaminants around connecting lead 498. The end of connecting lead 498 may be left bare to provide for electrical contact.

A variety of manufacturing processes may be suitable for manufacturing organic electronic devices of the present invention. In some cases, multiple devices may be made on a single substrate for high-throughput manufacturing. For example, multiple devices may be made using a conventional batch process, or by a continuous process, such as roll-to-roll processing on a flexible substrate. As such, in certain embodiments of the present invention, a plurality of functional organic bodies (for organic electronic devices) are formed on a substrate. A barrier coating, which may be a hybrid layer of the present invention or any other suitable type of permeation barrier, is then applied over the functional organic elements. For a polymer substrate, the underside of the substrate may also be coated with a barrier coating, which may be a hybrid layer of the present invention or any other suitable type of permeation barrier. The substrate is then cut to make individual organic electronic devices. In such cases, the cut edges of the device may be exposed. To protect the exposed edges of the devices, a hybrid layer of the present invention may be used as an edge barrier.

Figure 37A:
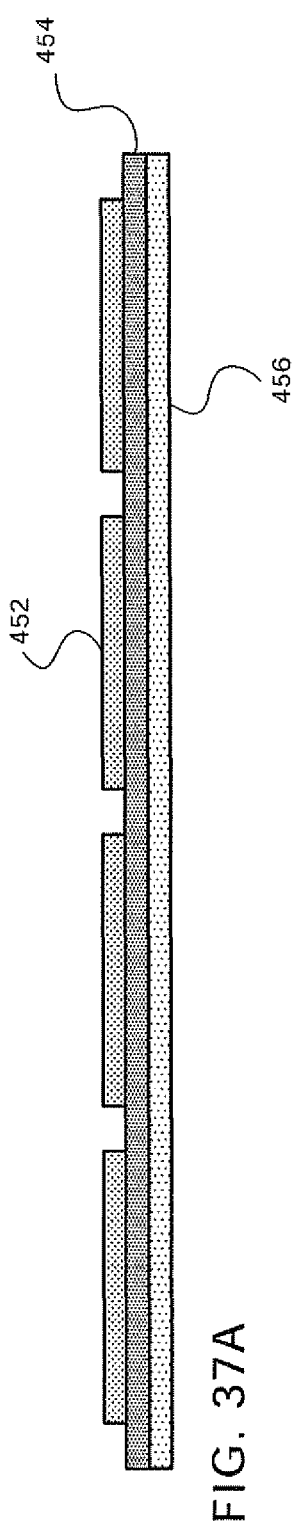
FIGS. 37A-37C show a method for making multiple OLEDs on a single substrate sheet.
Figure 37B:
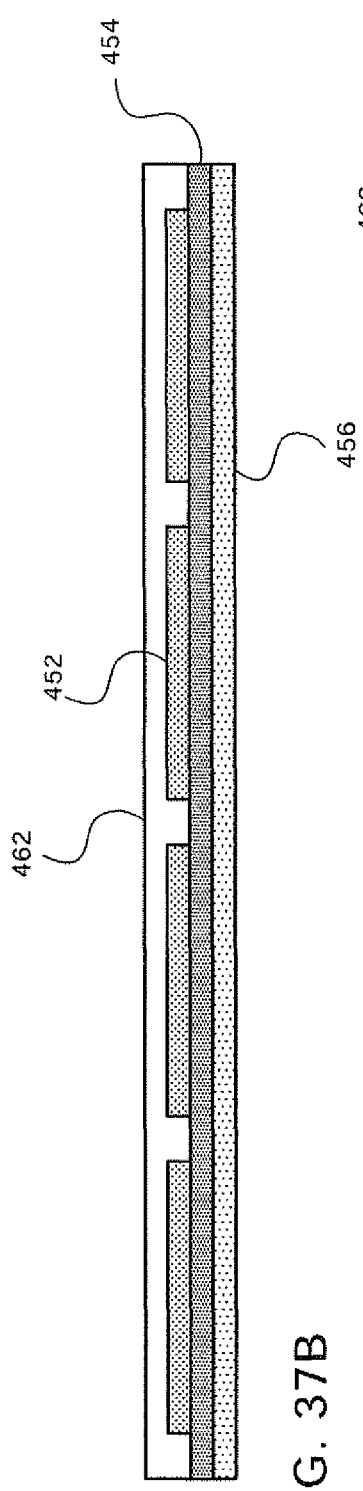
Figure 37C:
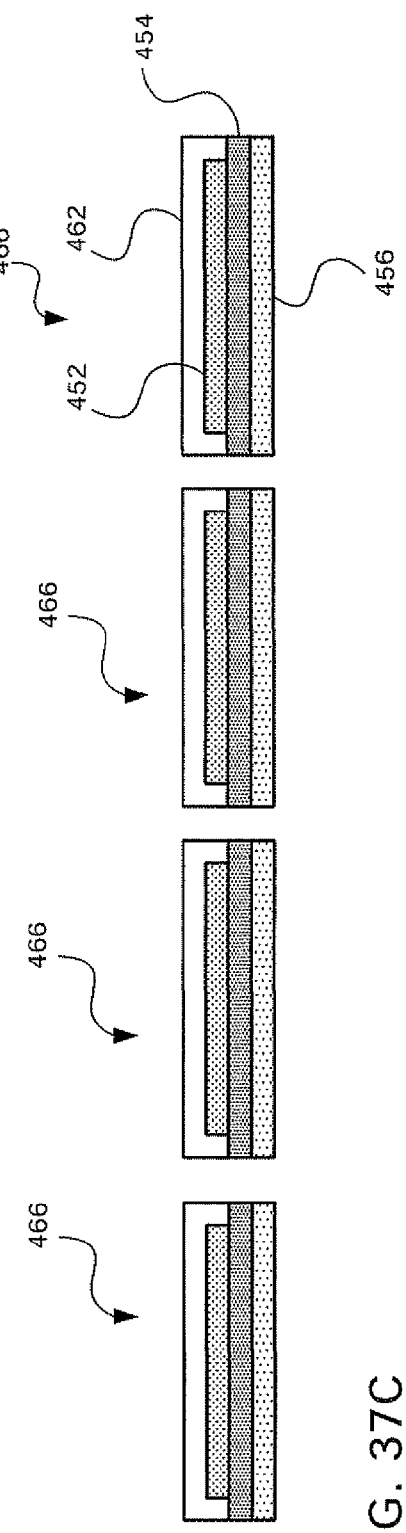

For example, FIGS. 37A-37C show a flexible metal sheet 456 having a planarizing layer 454 with multiple functional organic bodies 452 being formed thereon. As shown in FIG. 37B, a barrier coating 462 is then deposited over the functional organic bodies 452. Barrier coating 462 may be a hybrid layer of the present invention or any of other suitable type of permeation barrier known in the art. As shown in FIG. 37C, the individual functional organic bodies are then cut and separated to form individual OLEDs 466.

Figure 38:
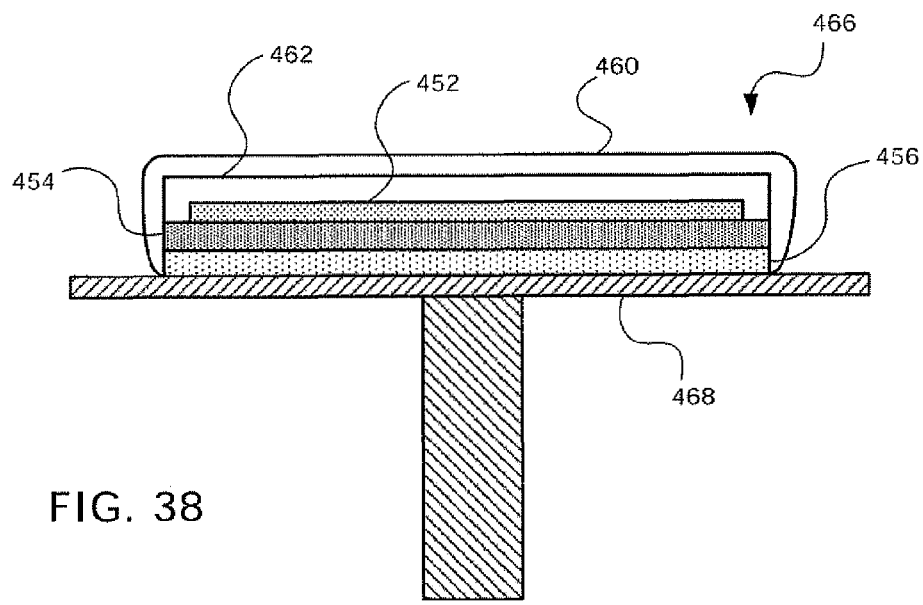
FIG. 38 shows a method for coating the cut edge of an OLED.
Figure 39:
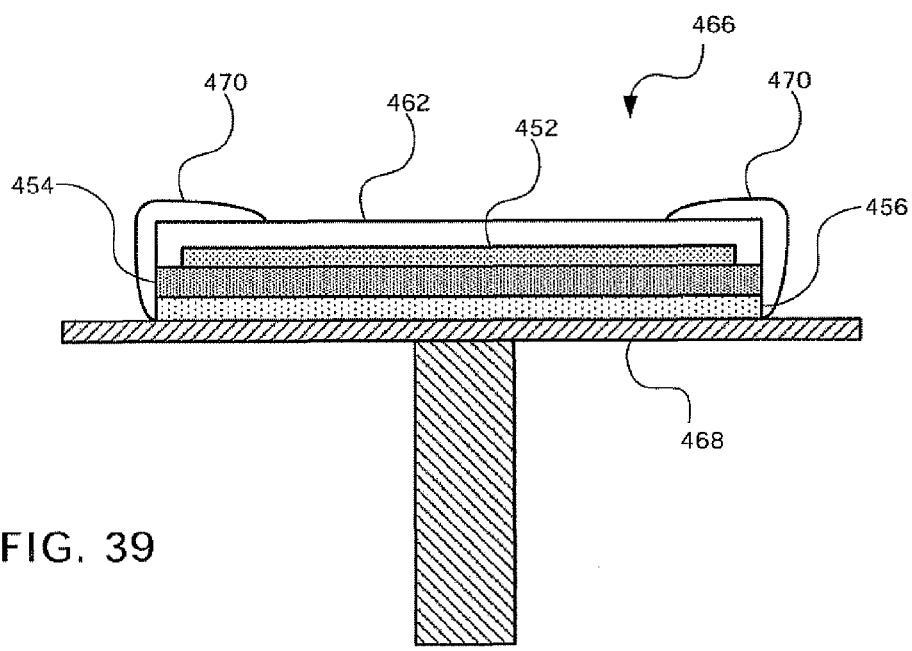
FIG. 39 shows another method for coating the cut edge of an OLED.

The cut edges of OLEDs 466 can be coated with a hybrid layer to protect against the lateral diffusion of environmental contaminants. For example, referring to FIG. 38, an OLED 466 is placed inside a deposition reaction chamber and held by a substrate holder 468. A hybrid layer 460 is then deposited over OLED 466. Hybrid layer 460 covers over the top surface of barrier coating 462, as well as the side edges of planarizing layer 454 and substrate 456. FIG. 39 shows an alternate embodiment where a hybrid layer 470 covers over the side edges of planarizing layer 454 and substrate 456, but with limited coverage of the top surface of OLED 466. This approach may be useful in devices having a very large area that are cut or trimmed at its edges. In such cases, if the hybrid layer is needed only to protect the side edges of the device, covering the entire device with the hybrid layer would not be necessary.

Figure 40:
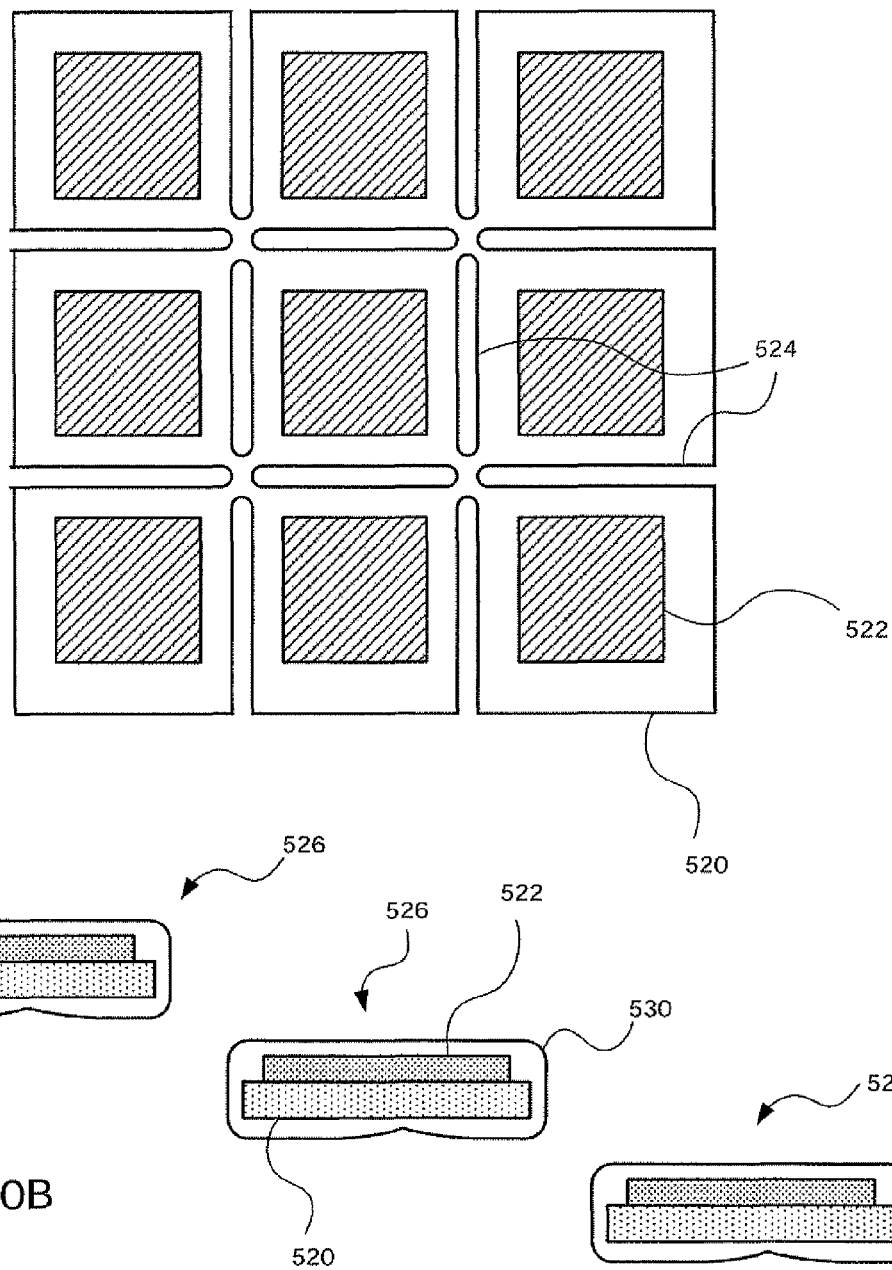
FIGS. 40A and B show another method for making multiple OLEDs on a single substrate sheet.

Deposition of the hybrid layer may also be incorporated into a high-throughput manufacturing process for making organic electronic devices. For example, FIG. 40A shows a flexible substrate sheet 520 with multiple functional organic bodies 522 being formed thereon. Flexible substrate sheet 520 has a pattern of through-holes 524 located between functional organic bodies 522. Through-holes 524 penetrate through the full thickness of substrate sheet 520 and may have any suitable pattern, shape, dimensions, or density to facilitate the dividing of substrate sheet 520 between functional organic bodies 522. Through-holes 524 may be formed (e.g., by laser cutting or stamping) before or after functional organic bodies 522 are formed on substrate sheet 520. A hybrid layer is then deposited over functional organic bodies 522. Diffusion of the active plasma species into through-holes 524 results in the coating of through-holes 524 with the hybrid layer. The hybrid layer may also coat the underside of substrate sheet 520 via through-holes 524. Through-holes 524 are sized to facilitate the diffusion of the active plasma species into through-holes 524. For example, the aspect ratio of through-holes 524 may be selected to facilitate diffusion. In some cases, through-holes 524 are at least as wide as the thickness of substrate sheet 520. As shown in FIG. 40B, multiple individual OLEDs 526 are provided when substrate sheet 520 is divided (e.g., by cutting or breaking) along through-holes 524. Each OLED 526 has hybrid layer 530 covering its lateral sides as well as the undersides of substrate 520.

The deposition processes used in the present invention may subject the organic electronic device to high temperatures. As such, in certain embodiments, the present invention also provides a method of cooling the organic electronic device during the deposition process by transferring heat away from the device. One approach for transferring heat away from the device is by conduction through the substrate holder. This approach may be especially useful where the substrate is a metal substrate. In such cases, for example, the substrate holder may be cooled or connected to a heat sink to extract heat from the substrate.

Figure 41:
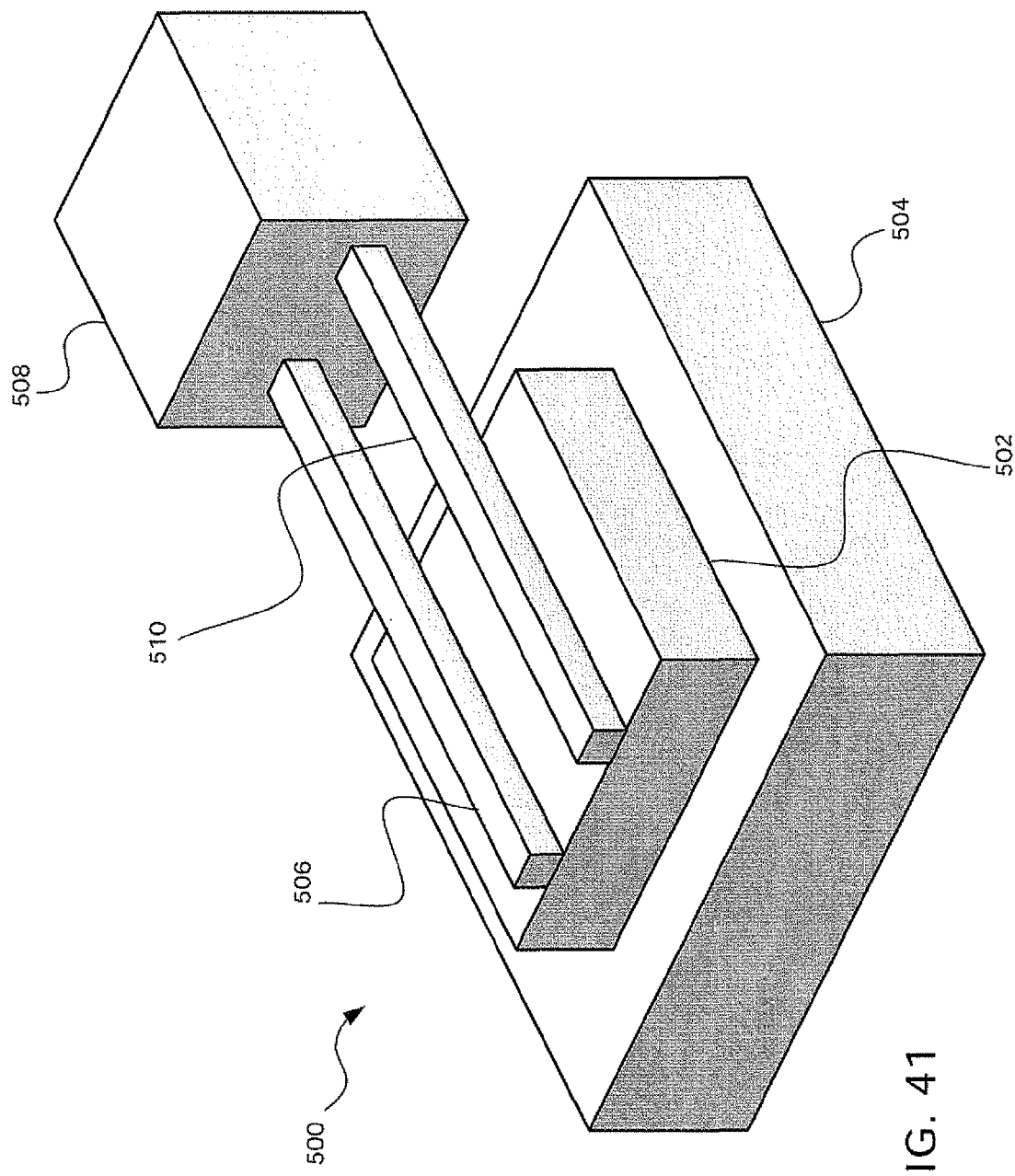
FIG. 41 shows a method for drawing heat away from an OLED during the deposition of a hybrid layer.

Another approach for transferring heat away from the device is through one of the electrodes of the device. This approach may be useful where the substrate is made of a thermally insulative material (e.g., some polymer substrates), and therefore, could not be used effectively to conduct heat away from the device. For example, referring to FIG. 41, an OLED 500 has a functional organic body 502 mounted on a substrate 504. OLED 500 has top metal electrodes 506 (e.g., cathodes) that extend outward via connecting leads 510 to connect with a heat sink 508. Heat sink 508 may be any suitable structure or assembly that can be used for dissipating heat (e.g., metal strips, radiators, cooling fans, etc.). During the deposition of a hybrid layer over OLED 500, heat is conducted away from OLED 500 through electrodes 506 and connecting leads 510, and transferred to heat sink 508.

The foregoing description and examples have been set forth merely to illustrate the invention and are not intended to be limiting. Each of the disclosed aspects and embodiments of the present invention may be considered individually or in combination with other aspects, embodiments, and variations of the invention. Modifications of the disclosed embodiments incorporating the spirit and substance of the invention may occur to persons skilled in the art and such modifications are within the scope of the present invention.

We claim:

1. An electronic device comprising: a substrate; a functional organic body disposed over the substrate; a hybrid layer disposed over the functional organic body, wherein the hybrid layer comprises a mixture of polymeric silicon and silicon oxide; and an intervening layer that is disposed between the hybrid layer and the top surface of the functional organic body, wherein the intervening layer serves to adhere the hybrid layer to the top surface of the functional organic body; and a barrier coating disposed over the hybrid layer and extending over an edge of the hybrid layer; and a desiccant material disposed between the barrier coating and the hybrid layer.

2. An electronic device comprising: a substrate; a functional organic body disposed over the substrate; a hybrid layer disposed over the functional organic body, wherein the hybrid layer comprises a mixture of polymeric silicon and silicon oxide; an intervening layer that is disposed between the hybrid layer and the top surface of the functional organic body, wherein the intervening layer serves to adhere the hybrid layer to the top surface of the functional organic body; and an edge barrier at one or more areas peripherally adjacent the organic device body, wherein the edge barrier comprises a dessicant material.

3. An electronic device comprising: a substrate; a functional organic body disposed over the substrate; an interconnecting lead connected to the functional organic body; and a hybrid layer disposed over the functional organic body and covering over at least a portion of the interconnecting lead, the hybrid layer comprising a mixture of polymeric silicon and silicon oxide.

4. The device of claim 3, wherein the hybrid layer covers over a lateral edge of the interconnecting lead.

5. The device of claim 4, wherein the interconnecting lead does not extend to the edge of the substrate.

6. The device of claim 4, wherein interconnecting lead includes a protruding portion which protrudes through the hybrid layer.

7. The device of claim 3, wherein the interconnecting lead has a step portion, the hybrid layer covering over the step portion of the interconnecting lead.

* * * * *